(12) United States Patent
Kong et al.

(10) Patent No.: US 10,432,164 B2
(45) Date of Patent: Oct. 1, 2019

(54) IMPEDANCE MATCHING CIRCUIT OF COMMUNICATION APPARATUS

(71) Applicant: ELECTRONICS AND TELECOMMUNICATIONS RESEARCH INSTITUTE, Daejeon (KR)

(72) Inventors: Sun Woo Kong, Daejeon (KR); Cheol Ho Kim, Daejeon (KR); Bong Hyuk Park, Daejeon (KR); Hui Dong Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/835,148

(22) Filed: Dec. 7, 2017

(65) Prior Publication Data
US 2018/0167048 A1    Jun. 14, 2018

(30) Foreign Application Priority Data

Dec. 8, 2016  (KR) .................. 10-2016-0166676
Nov. 28, 2017  (KR) .................. 10-2017-0160932

(51) Int. Cl.
*H03H 7/38*  (2006.01)
*H03H 7/40*  (2006.01)
(Continued)

(52) U.S. Cl.
CPC ............ *H03H 7/40* (2013.01); *H01F 27/29* (2013.01); *H03F 1/565* (2013.01); *H03F 3/19* (2013.01);
(Continued)

(58) Field of Classification Search
CPC ............ H03H 7/38; H03H 7/40; H03H 7/383; H03H 7/09; H03H 2007/386; H03F 1/565;
(Continued)

(56) References Cited

U.S. PATENT DOCUMENTS 1,625,840 A  *  4/1927  Whittle ............ H04L 25/03127
                                                          333/32
2,718,622 A  *  9/1955  Harkless ............ H04B 3/141
                                                          333/171
(Continued)

FOREIGN PATENT DOCUMENTS

KR    10-0872514 B1   12/2008
KR    10-1660591 B1    9/2016

*Primary Examiner* — Stephen E. Jones
(74) *Attorney, Agent, or Firm* — Rabin & Berdo, P.C.

(57) ABSTRACT

A matching circuit in a communication apparatus may comprise a first inductor disposed at a primary side of a transformer; a second inductor disposed at a secondary side of the transformer; and an impedance element connected to the first inductor and the second inductor. Also, a first terminal of the first inductor may be connected to an input terminal of the transformer, a second terminal of the first inductor may be connected to a common node connected to a ground, a first terminal of the second inductor may be connected to an output terminal of the transformer, a second terminal of the second inductor may be connected to the common node, a first terminal of the impedance element may be connected to the common node, and a second terminal of the impedance element may be connected to the ground.

8 Claims, 18 Drawing Sheets

(51) Int. Cl.
*H03F 3/19* (2006.01)
*H03F 1/56* (2006.01)
*H01F 27/29* (2006.01)
*H03H 11/32* (2006.01)
*H03H 7/09* (2006.01)
*H03F 3/193* (2006.01)
*H04M 1/76* (2006.01)

(52) U.S. Cl.
CPC ............... *H03F 3/193* (2013.01); *H03H 7/09* (2013.01); *H03H 7/38* (2013.01); *H03H 11/32* (2013.01); *H03F 2200/222* (2013.01); *H03F 2200/492* (2013.01); *H03F 2200/534* (2013.01); *H03F 2200/541* (2013.01); *H04M 1/76* (2013.01)

(58) Field of Classification Search
CPC ................ H03F 1/56; H03F 2200/222; H03F 2200/534; H03F 2200/541
USPC ...................................................... 333/32, 33
See application file for complete search history.

(56) References Cited

U.S. PATENT DOCUMENTS

| | | | |
|---|---|---|---|
| 2,909,663 A * | 10/1959 | McFarlane | G01T 1/17 |
| | | | 250/374 |
| 7,917,105 B2 | 3/2011 | Drogi et al. | |
| 8,487,703 B2 * | 7/2013 | Blednov | H01L 23/64 |
| | | | 330/124 R |
| 8,611,834 B2 | 12/2013 | Harris et al. | |
| 9,337,183 B2 | 5/2016 | Marbell et al. | |
| 9,391,650 B2 | 7/2016 | Aparin | |
| 9,438,199 B2 | 9/2016 | Kang et al. | |
| 2008/0055015 A1* | 3/2008 | Blednov | H01F 17/0033 |
| | | | 333/32 |
| 2010/0156194 A1* | 6/2010 | Navid | H01F 17/04 |
| | | | 307/105 |
| 2013/0293295 A1 | 11/2013 | Noh et al. | |
| 2017/0324158 A1* | 11/2017 | Akiyama | H01Q 1/50 |

* cited by examiner

IMPEDANCE MATCHING CIRCUIT OF COMMUNICATION APPARATUS

CROSS-REFERENCE TO RELATED APPLICATIONS

This application claims priorities to Korean Patent Applications No. 10-2016-0166676 filed on Dec. 8, 2016, and No. 10-2017-0160932 filed on Nov. 28, 2017 in the Korean Intellectual Property Office (KIPO), the entire contents of which are hereby incorporated by reference.

BACKGROUND

1. Technical Field

The present disclosure relates to an impedance matching circuit of a communication apparatus, and more specifically, to an impedance matching circuit able to adjust mutual inductance and coupling coefficients, and reduce the occupied size of the circuit.

2. Related Art

Communication systems or sensor systems such as a radar system operate using high-frequency signals. Since the high-frequency signals are not transmitted but reflected when an impedance mismatch exists, they have characteristics of severe attenuation. Therefore, a matching circuit is indispensably required in the communication systems, and a matching circuit may be designed to have a desired impedance value at a specific frequency by using elements such as at least one inductor or at least one capacitor.

As described above, in the communication systems using the high-frequency such as a radio frequency (RF) system, the impedance matching circuit is used to resolve the problem that signals are not transmitted but reflected when an impedance mismatch exists. However, there are many limitations in designing the matching circuit. Specifically, in order to match a large impedance to a small impedance, there is a problem that a circuit size increases and a frequency response characteristic is limited.

SUMMARY

Accordingly, embodiments of the present disclosure provide a matching circuit for a communication apparatus, which is capable of increasing a mutual inductance per area, and finely adjusting the inductance value when configuring the matching circuit by using a transformer.

Accordingly, embodiments of the present disclosure also provide a matching circuit of a communication apparatus, which is capable of adjusting a coupling coefficient between a primary coil and a secondary coil without being influenced by specific implementations of the transformer, and controlling polarities of both ends of the transformer.

In order to achieve the objective of the present disclosure, a matching circuit in a communication apparatus may comprise a first inductor disposed at a primary side of a transformer; a second inductor disposed at a secondary side of the transformer; and an impedance element connected to the first inductor and the second inductor. Also, a first terminal of the first inductor may be connected to an input terminal of the transformer, a second terminal of the first inductor may be connected to a common node connected to a ground, a first terminal of the second inductor may be connected to an output terminal of the transformer, a second terminal of the second inductor may be connected to the common node, a first terminal of the impedance element may be connected to the common node, and a second terminal of the impedance element may be connected to the ground.

Magnetic fluxes of the first inductor and the second inductor may be formed in a same direction so as to form a positive mutual inductance.

The impedance element may be a third inductor, and the third inductor may boost the positive mutual inductance.

The impedance element may be a capacitor, and the capacitor may reduce the positive mutual inductance.

Magnetic fluxes of the first inductor and the second inductor may be formed in opposite directions so as to form a negative mutual inductance.

The impedance element may be a third inductor, and the third inductor may reduce the negative mutual inductance.

The impedance element may be a capacitor, and the capacitor may boost the negative mutual inductance.

In order to achieve the objective of the present disclosure, a matching circuit in a communication apparatus may comprise a first inductor disposed at a primary side of a transformer; a second inductor disposed at a secondary side of the transformer; a third inductor disposed as a tertiary side of the transformer; and an impedance element connected to the first inductor and the second inductor. Also, a first terminal of the first inductor may be connected to an input terminal of the transformer, a second terminal of the first inductor may be connected to a common node connected to a ground, a first terminal of the second inductor may be connected to a high-frequency amplifier, a second terminal of the second inductor may be connected to the common node, a first terminal of the third inductor may be connected to the high-frequency amplifier, a second terminal of the third inductor may be connected to the ground, a first terminal of the impedance element may be connected to the common node, and a second terminal of the impedance element may be connected to the ground.

Magnetic fluxes of the first inductor and the second inductor may be formed in opposite directions so as to form a negative mutual inductance between the first inductor and the second inductor.

The impedance element may be a capacitor, and the capacitor may boost the negative mutual inductance formed between the first inductor and the second inductor.

Magnetic fluxes of the second inductor and the third inductor are formed in a same direction so as to form a negative mutual inductance between the second inductor and the third inductor.

The first terminal of the second inductor may be connected to a base of a transistor constituting the high-frequency amplifier, and the first terminal of the third inductor may be connected to a source of the transistor.

Magnetic fluxes of the first inductor and the second inductor may be formed in a same direction so as to form a positive mutual inductance between the first inductor and the second inductor.

Magnetic fluxes of the second inductor and the third inductor may be formed in opposite directions so as to form a negative mutual inductance between the second inductor and the third inductor.

The first terminal of the second inductor may be connected to a base of a transistor constituting the high-frequency amplifier, and the first terminal of the third inductor may be connected to a source of the transistor.

The matching circuits of a communication apparatus according to the embodiments of the present disclosure can increase the mutual inductance value per area and finely adjust the inductance value when the matching circuit using the transformer is used. Also, the coupling coefficient between the primary coil and the secondary coil can be controlled, and the polarities of both ends of the transformer can be adjusted without being affected by specific implementations of the transformer. Also, a capacitor or an inductor can be connected to the common node to boost the mutual inductance of the transformer, and to increase the pass gain.

BRIEF DESCRIPTION OF DRAWINGS

Embodiments of the present disclosure will become more apparent by describing in detail embodiments of the present disclosure with reference to the accompanying drawings, in which.

DETAILED DESCRIPTION

Figure 1:
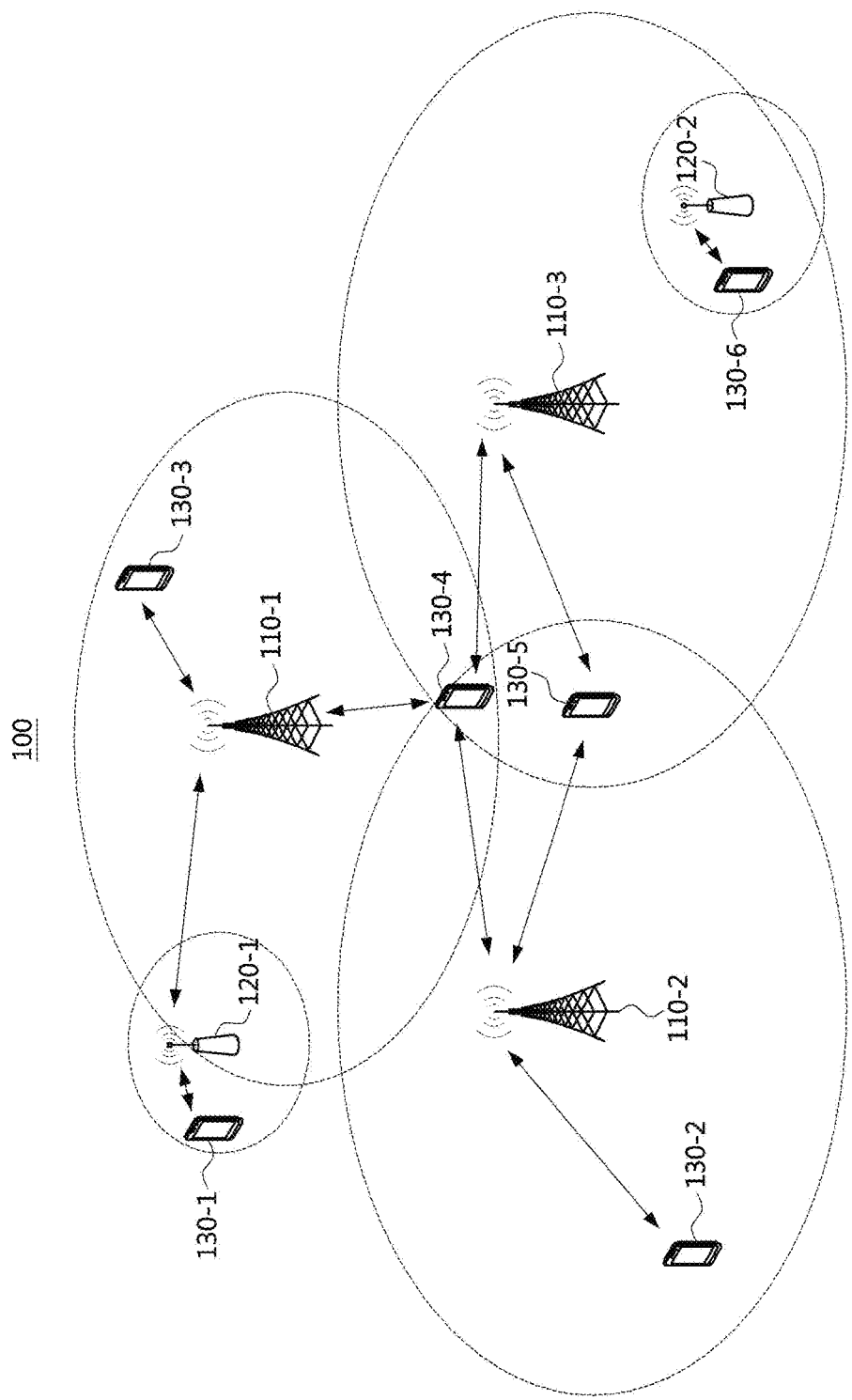
FIG. 1 is a conceptual diagram illustrating a first embodiment of a communication system.

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings. In order to facilitate general understanding in describing the present disclosure, the same components in the drawings are denoted with the same reference signs, and repeated description thereof will be omitted.

Hereinafter, wireless communication networks to which exemplary embodiments according to the present disclosure will be described. However, wireless communication networks to which exemplary embodiments according to the present disclosure are applied are not restricted to what will be described below. That is, exemplary embodiments according to the present disclosure may be applied to various wireless communication networks.

FIG. 1 is a conceptual diagram illustrating a first embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Also, the communication system 100 may also be referred to as a 'communication network', and may comprise a core network (e.g., a serving gateway (S-GW), a packet data network (PDN) gateway (P-GW), a mobility management entity (MME), and the like).

The plurality of communication nodes may support $4^{th}$ generation (4G) communication (e.g., long term evolution (LTE), LTE-advanced (LTE-A)), or $5^{th}$ generation (5G) communication defined in the $3^{rd}$ generation partnership project (3GPP) standard. The 4G communication may be performed in a frequency band below 6 gigahertz (GHz), and the 5G communication may be performed in a frequency band above 6 GHz. For example, for the 4G and 5G communications, the plurality of communication nodes may support at least one communication protocol among a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, and a space division multiple access (SDMA) based communication protocol. Also, each of the plurality of communication nodes may have the following structure.

Figure 2:
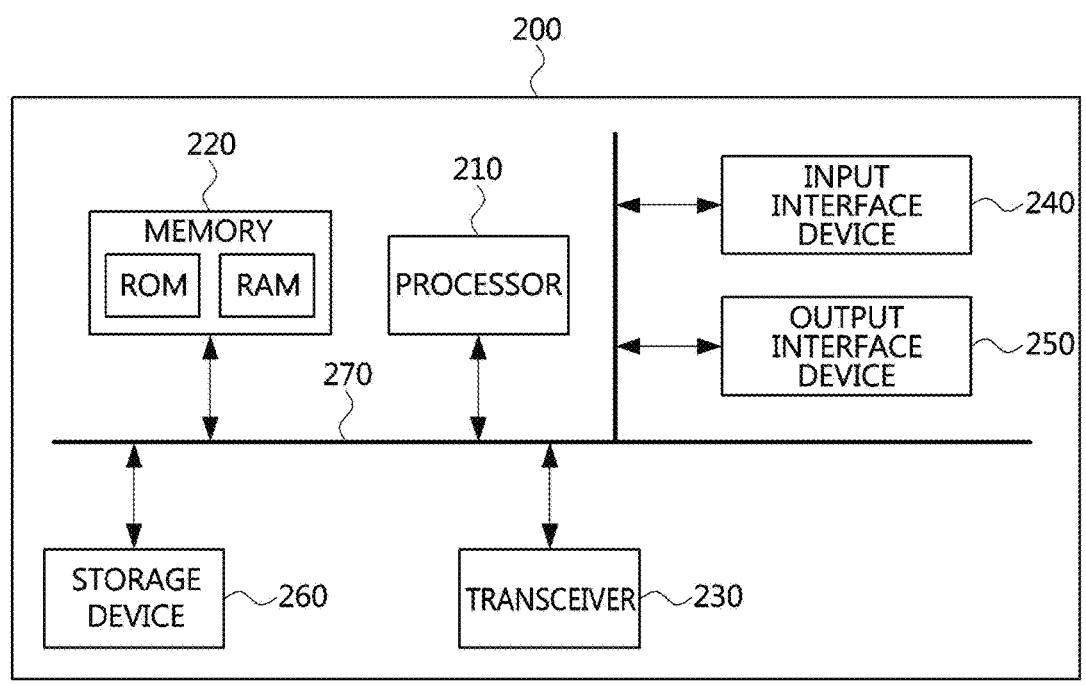
FIG. 2 is a block diagram illustrating a first embodiment of a communication node constituting a communication system.

FIG. 2 is a block diagram illustrating a first embodiment of a communication node constituting a communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a base transceiver station (BTS), a radio base station, a radio transceiver, an access point, an access node, or the like. Also, each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, or the like.

Each of the plurality of communication nodes 110-1, 110-2, 110-3, 120-1, 120-2, 130-1, 130-2, 130-3, 130-4, 130-5, and 130-6 may support cellular communications (e.g., the LTE or the LTE-advanced (LTE-A) defined in the 3GPP). Each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Each of the plurality of base stations 110-1, 110-2, 110-3, 120-1, and 120-2 may support OFDMA based downlink (forward link) transmissions, and SC-FDMA based uplink (reverse link) transmissions. Also, each of the plurality of base stations 110-1, 110-2, 110-3, 120-1, and 120-2 may support a multi-input multi-output (MIMO) transmission (e.g., a single-user MIMO (SU-MIMO), a multi-user MIMO (MU-MIMO), a massive MIMO, or the like), a coordinated multipoint (CoMP) transmission, a carrier aggregation (CA) transmission, a transmission in unlicensed band, a device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2).

For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner. The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may perform coordination on D2D communications between the fourth terminal 130-4 and the fifth terminal 130-5, and thus the fourth terminal 130-4 and the fifth terminal 130-5 may perform the D2D communications under coordination of the second base station 110-2 and the third base station 110-3.

In order to receive high-frequency signals used in a radio frequency (RF) communication system, a high-frequency amplifier for increasing sensitivity, signal to noise ratio (SNR), and selectivity by amplifying a high-frequency voltage received at a receiver. Such the high-frequency amplifier may configure a specific matching circuit at input and output stages corresponding to its operating frequency in order to obtain good operating characteristics at a specific operating frequency.

Figure 3:
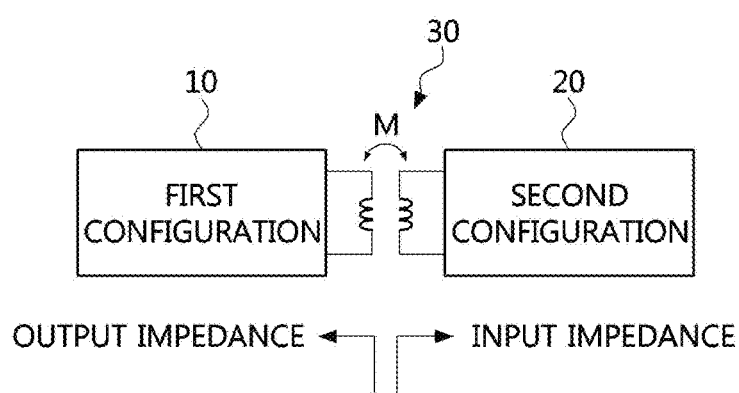
FIG. 3 is a diagram illustrating a matching circuit disposed between configurations in an RF communication system.
Figure 4:
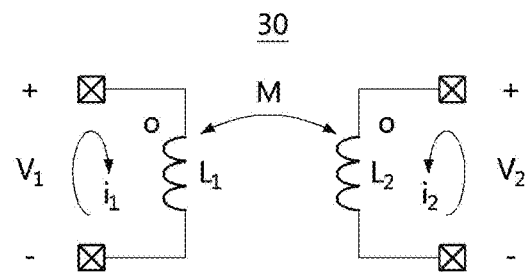
FIG. 4 is a diagram for explaining an operation method of the matching circuit shown in FIG. 3.

FIG. 3 is a diagram illustrating a matching circuit disposed between configurations in an RF communication system, and FIG. 4 is a diagram for explaining an operation method of the matching circuit shown in FIG. 3.

Referring to FIGS. 3 and 4, when a high-frequency is used in an RF communication system, a signal may be not properly transmitted but reflected due to an impedance difference. In order to solve this problem, it is possible to arrange an impedance matching circuit 30 between a first configuration 10 and a second configuration 20 of the RF communication system to adjust the impedance difference at both ends. Here, the transformer-based matching circuit 30 may be composed of a combination of at least one inductor and at least one capacitor, and may be formed to have a desired impedance value at a specific frequency.

The transformer-based matching circuit 30 may match a wide bandwidth and may adjust polarities of voltages induced in a primary inductor $L_1$ and a secondary inductor $L_2$ according to a coupling direction. Also, the matching circuit 30 may control ratios of voltages and currents between a primary side and a secondary side, and have an advantage that a large inductance can be obtained with a small area. The directions in which magnetic fluxes are generated by the primary and secondary inductors may coincide or not according to directions in which the primary inductor $L_1$ and the secondary inductor $L_2$ are wounded. Also, a dot may be drawn in the direction in which the current is input to the inductor according to a dot convention. In FIG. 4, the induced voltages at the primary side and the secondary side have the same polarity so that a positive (+) mutual inductance M is formed. The voltages and currents of the primary side and the secondary side arranged in the matching circuit 30 may be expressed by Equation 1 below.

$$V_1 = j\omega L_1 I_1 + j\omega M I_2 \qquad \text{[Equation 1]}$$
$$V_2 = j\omega M I_1 + j\omega L_2 I_2$$
$$M = k\sqrt{L_1 L_2}$$
$$V_1 = j\omega\left(L_1 - \frac{M^2}{L_2}\right)I_1 + \frac{M}{L_2}V_2$$

In Equation 1, $V_1$ denotes a voltage at the primary side, $V_2$ denotes a voltage at the secondary side, M denotes mutual inductance, $L_1$ denotes an inductance of the primary side inductor, $L_2$ denotes an inductance of the secondary side, $I_1$ denotes a current of the primary side, and $I_2$ denotes a current of the secondary side. As represented in Equation 1, the primary inductor $L_1$ and the secondary inductor $L_2$ may be coupled to each other by the mutual inductance M.

Figure 5:
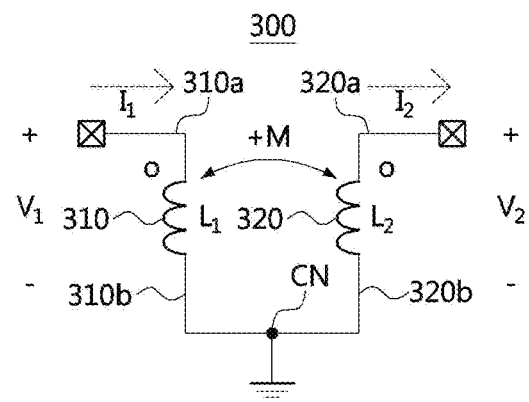
FIG. 5 is a diagram illustrating a matching circuit according to a first embodiment of the present disclosure.
Figure 6:
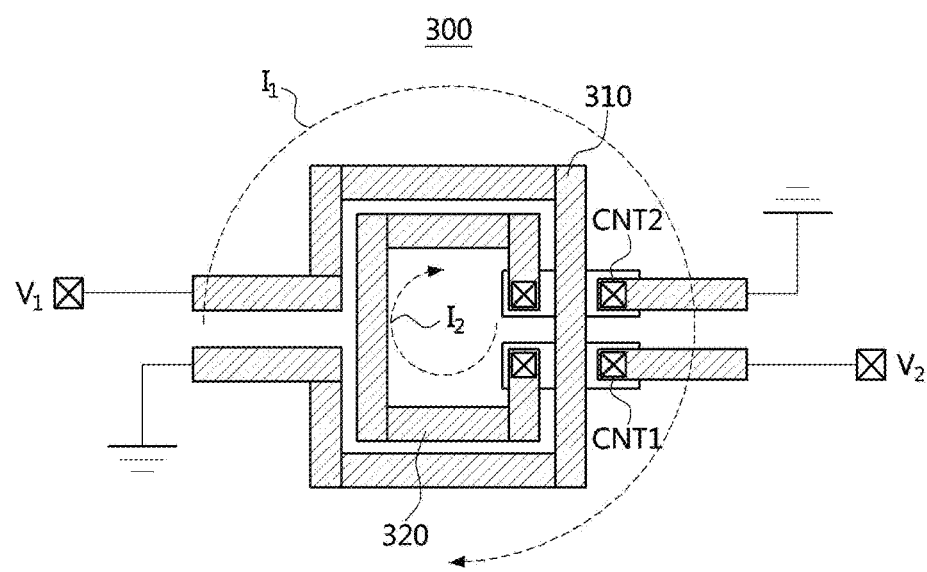
FIG. 6 is a diagram illustrating a layout of the matching circuit according to the first embodiment of the present disclosure.

FIG. 5 is a diagram illustrating a matching circuit according to a first embodiment of the present disclosure, and FIG. 6 is a diagram illustrating a layout of the matching circuit according to the first embodiment of the present disclosure.

Referring to FIGS. 5 and 6, the matching circuit 300 according to the first embodiment of the present disclosure may comprise a first inductor 310 disposed at a primary side and a second inductor 320 disposed at a secondary side.

A first voltage $V_1$ may be formed between a first terminal 310*a* and a second terminal 310*b* of the first inductor 310, and a first current $I_1$ may flow through the first inductor 310 according to the first voltage $V_1$. The second inductor 320 may be disposed so as to face the first inductor 310 so that a mutual inductance M may be formed between the first inductor 310 and the second inductor 320. A second voltage $V_2$ may be formed between a first terminal 320*a* and a second terminal 320*b* of the second inductor 320, and a second current $I_2$ may flow through the second inductor 320 according to the second voltage $V_2$. The second terminal 310*b* of the first inductor 310 and the second terminal 320*b* of the second inductor 320 may be connected to a ground through a common node CN.

Here, values of the second voltage $V_2$ and the second current $I_2$ may vary depending on a turn ratio of the first inductor 310 and the second inductor 320. As an example, in FIGS. 5 and 6, the first inductor 310 and the second inductor 320 have a turn ratio of 1:1. Also, a polarity of the mutual inductance M may vary according the directions in which the first inductor 310 and the second inductor 320 are wounded. For example, in FIGS. 5 and 6, the first inductor 310 and the second inductor 320 are wounded in the same direction so that a positive mutual inductance (+M) is formed. That is, magnetic fluxes of the first inductor 310 and the second inductor 320 are formed in the same direction, and the value of mutual inductance M has a positive (+) sign.

As shown in FIG. 6, the first inductor 310 and the second inductor 320 may be formed by forming respective wirings on a substrate. Specifically, in forming the first inductor 310 and the second inductor 320 on the substrate, the wiring of the first inductor 310 may be formed so as to surround the wiring of the second inductor 320, and thus the wiring of the second inductor 320 may be formed inside the wiring of the first inductor 310. The first terminal 310a of the first inductor 310 may be connected to an input terminal, and the second terminal 310b of the first inductor 310 may be connected to the ground.

Since the wiring of the second inductor 320 is formed inside the wiring of the first inductor 310, the first terminal 320a of the second inductor 320 may be connected to an output terminal by avoiding the wiring of the first inductor 310 through a first contact CNT1 in order to prevent the first terminal 310a of the first inductor 310 from contacting the first terminal 320a of the second inductor 320. Also, the second terminal 320b of the second inductor 320 may be connected to the ground GND across the wiring of the first inductor 310 through a second contact CNT2. However, embodiments of the present disclosure are not limited thereto. The wiring of the second inductor 320 may be formed so as to surround the wiring of the first inductor 310, and the wiring of the first inductor 310 may be formed inside the wiring of the second inductor 320. In this case, the first terminal 310a of the first inductor 310 may be connected to the input terminal through a contact, and the second terminal 310b of the first inductor 310 may be connected to the ground GND through a contact.

Here, the first inductance value $L_1$ may be controlled by adjusting the length of the wiring that forms the first inductor 310, and the second inductance value $L_2$ may be controlled by adjusting the length of the wiring that forms the second inductor 320. The wiring of the first inductor 310 and the wiring of the second inductor 320 may be formed using a semiconductor manufacturing process, and the length of each wiring may be finely adjusted. Accordingly, the first inductance value, the second inductance value, and the mutual inductance M may be finely adjusted.

The directions in which the first current $I_1$ and the second current $I_2$ flow may be controlled according to winding directions of wires forming the first inductor 310 and the second inductor 320 so as to control the sign of the mutual inductance. As shown in FIG. 6, the direction of the first current $I_1$ flowing into the first inductor 310 and the direction of the second current $I_2$ flowing into the second inductor 320 are identical to each other, and the magnetic fluxes of the first inductor 310 and the second inductor 320 may be formed in the same direction so as to have the positive mutual inductance (M+).

Figure 7:
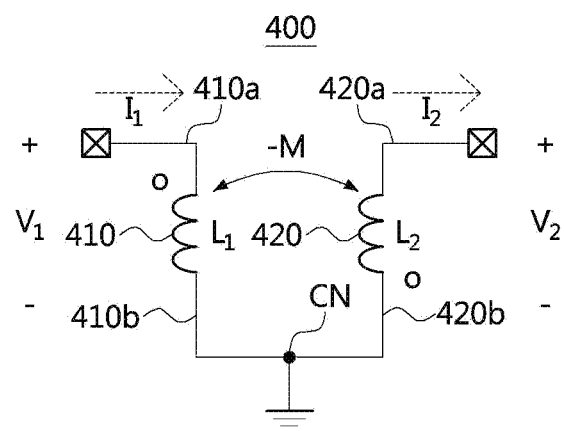
FIG. 7 is a diagram illustrating a matching circuit according to a second embodiment of the present disclosure.
Figure 8:
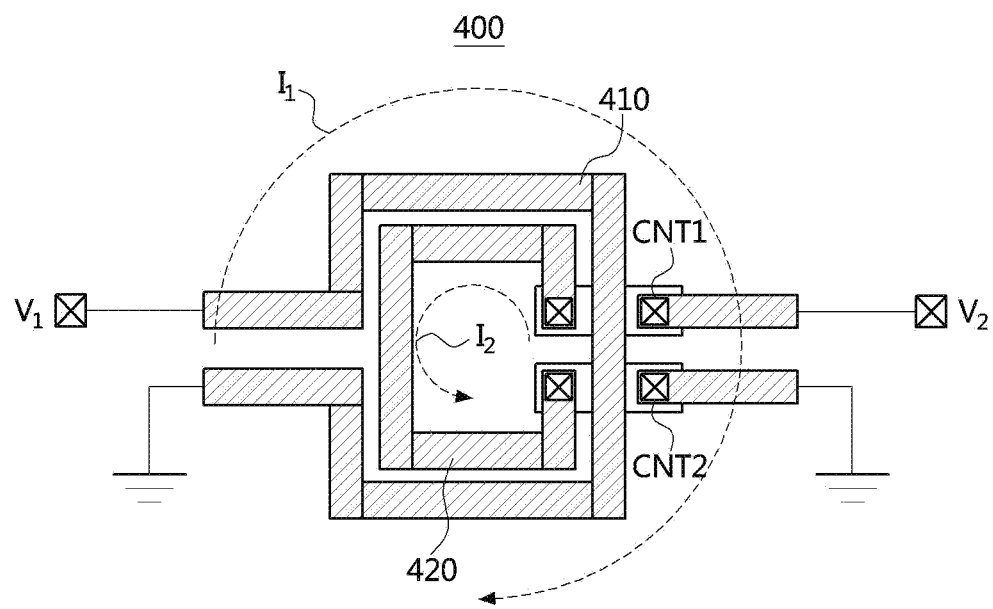
FIG. 8 is a diagram illustrating a layout of the matching circuit according to the second embodiment of the present disclosure.

FIG. 7 is a diagram illustrating a matching circuit according to a second embodiment of the present disclosure, and FIG. 8 is a diagram illustrating a layout of the matching circuit according to the second embodiment of the present disclosure.

Referring to FIGS. 7 and 8, the matching circuit 400 according to the second embodiment of the present disclosure may comprise a first inductor 410 disposed at a primary side and a second inductor 420 disposed at a secondary side.

A first voltage $V_1$ may be formed between a first terminal 410a and a second terminal 410b of the first inductor 410, and a first current $I_1$ may flow through the first inductor 410 according to the first voltage $V_1$. The second inductor 420 may be disposed so as to face the first inductor 410 so that a mutual inductance M may be formed between the first inductor 410 and the second inductor 420. A second voltage $V_2$ may be formed between a first terminal 420a and a second terminal 420b of the second inductor 420, and a second current $I_2$ may flow through the second inductor 420 according to the second voltage $V_2$. The second terminal 410b of the first inductor 410 and the second terminal 420b of the second inductor 420 may be connected to a ground through a common node CN.

Here, values of the second voltage $V_2$ and the second current $I_2$ may vary depending on a turn ratio of the first inductor 410 and the second inductor 420. As an example, in FIGS. 7 and 8, the first inductor 410 and the second inductor 420 have a turn ratio of 1:1. Also, a polarity of the mutual inductance M may vary according to the directions in which the first inductor 410 and the second inductor 420 are wounded. For example, in FIGS. 7 and 8, the first inductor 410 and the second inductor 420 are wounded in the opposite directions so that a negative mutual inductance (−M) is formed. That is, the first current $I_1$ of the first inductor 410 flows in a first direction, and the second current $I_2$ of the second inductor 420 flows in a second direction different from the first direction, so that magnetic fluxes of the first inductor 410 and the second inductor 420 are formed in the opposite directions. Thus, the value of mutual inductance M may have a negative (−) sign.

As shown in FIG. 8, the first inductor 410 and the second inductor 420 may be formed by forming respective wirings on a substrate. Specifically, in forming the first inductor 410 and the second inductor 420 on the substrate, the wiring of the first inductor 410 may be formed so as to surround the wiring of the second inductor 420, and thus the wiring of the second inductor 420 may be formed inside the wiring of the first inductor 410. The first terminal 410a of the first inductor 410 may be connected to an input terminal, and the second terminal 410b of the first inductor 410 may be connected to the ground.

Since the wiring of the second inductor 420 is formed inside the wiring of the first inductor 410, the first terminal 420a of the second inductor 420 may be connected to an output terminal through a first contact CNT1 by avoiding the wiring of the first inductor 410 in order to prevent the first terminal 410a of the first inductor 410 from contacting the first terminal 420a of the second inductor 420. Also, the second terminal 420b of the second inductor 420 may be connected to the ground across the wiring of the first inductor 410 through a second contact CNT2. However, embodiments of the present disclosure are not limited thereto. The wiring of the second inductor 420 may be formed so as to surround the wiring of the first inductor 410, and the wiring of the first inductor 410 may be formed inside the wiring of the second inductor 420. In this case, the first terminal 410a of the first inductor 410 may be connected to the input terminal through a contact, and the second terminal 410b of the first inductor 410 may be connected to the ground through a contact.

Here, the first inductance value $L_1$ may be controlled by adjusting the length of the wiring forming the first inductor 410, and the second inductance value $L_2$ may be controlled by adjusting the length of the wiring forming the second inductor 420. The wiring of the first inductor 410 and the wiring of the second inductor 420 may be formed using a semiconductor manufacturing process, and the length of each wiring may be finely adjusted. Accordingly, the first inductance value, the second inductance value, and the mutual inductance M may be finely adjusted.

The directions in which the first current $I_1$ and the second current $I_2$ flow may be controlled according to winding directions of wires forming the first inductor 410 and the second inductor 420 so as to control the sign of the mutual inductance. As shown in FIG. 8, the direction of the first current $I_1$ flowing through the first inductor 410 and the direction of the second current $I_2$ flowing through the second inductor 420 are opposite to each other, and the magnetic fluxes of the first inductor 310 and the second inductor 320 may be formed in the opposite directions so that the negative mutual inductance (−M) is formed.

Figure 9:
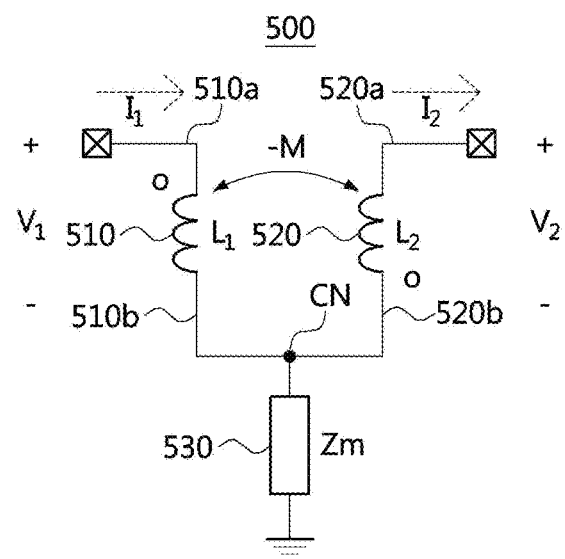
FIG. 9 is a diagram illustrating a matching circuit according to a third embodiment of the present disclosure.
Figure 10:
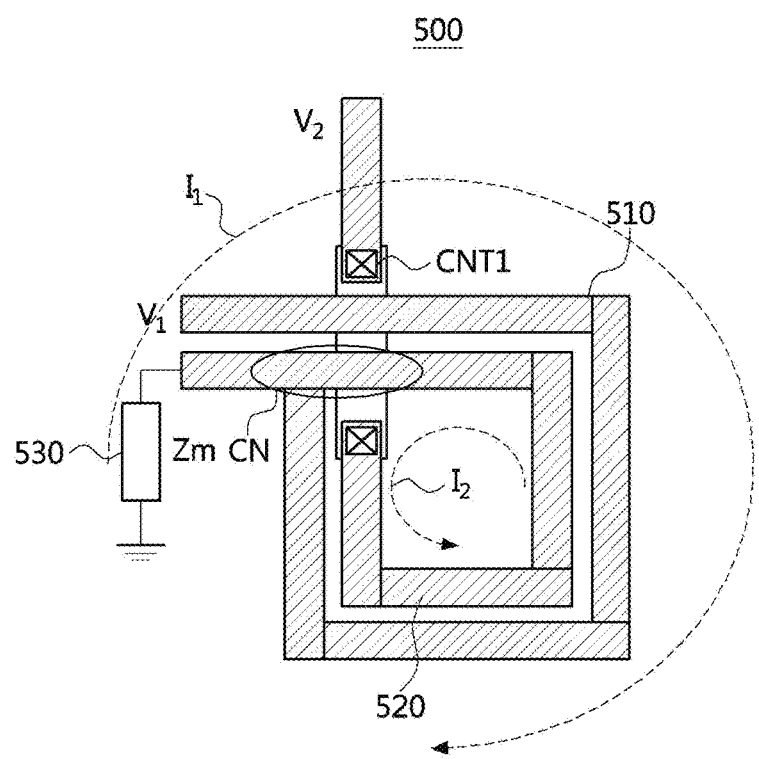
FIG. 10 is a diagram illustrating a layout of the matching circuit according to the third embodiment of the present disclosure.

FIG. 9 is a diagram illustrating a matching circuit according to a third embodiment of the present disclosure, and FIG. 10 is a diagram illustrating a layout of the matching circuit according to the third embodiment of the present disclosure.

Referring to FIGS. 9 and 10, the matching circuit 500 according to the third embodiment of the present disclosure may comprise a first inductor 510 disposed at a primary side, a second inductor 520 disposed at a secondary side, and an impedance element $Z_m$ 530.

The impedance element 530 may add or subtract inductance to or from a mutual inductance M by using at least one inductor or at least one capacitor. Also, the impedance element 530 is not limited to be formed by a combination of the at least one inductor and the at least one capacitor, and an element that can vary the inductance such as a varactor may be applied. The impedance element 530 may be connected to the first inductor 510 and the second inductor 520. Also, a first terminal of the impedance element 530 may be connected to a common node CN, and a second terminal of the impedance element 530 may be connected to a ground.

A first voltage $V_1$ may be formed between a first terminal 510a and a second terminal 510b of the first inductor 510, and a first current $I_1$ may flow through the first inductor 510 according to the first voltage $V_1$. The second inductor 520 may be disposed so as to face the first inductor 510 so that a mutual inductance M may be formed between the first inductor 510 and the second inductor 520. A second voltage $V_2$ may be formed between a first terminal 520a and a second terminal 520b of the second inductor 520, and a second current $I_2$ may flow through the second inductor 520 according to the second voltage $V_2$. The second terminal 510b of the first inductor 410 and the second terminal 520b of the second inductor 520 may be connected to the impedance element 530 through the common node CN. Also, the first terminal of the impedance element 530 may be connected to the second terminal 510b of the first inductor 510 and the second terminal 520b of the second inductor 520, and the second terminal of the impedance element 530 may be connected to the ground.

As an example, in FIGS. 9 and 10, the first inductor 510 and the second inductor 520 have a turn ratio of 1:1. Also, since the first inductor 510 and the second inductor 520 are wounded in the opposite directions so that a negative mutual inductance (−M) is formed. That is, the first current $I_1$ of the first inductor 510 flows in a first direction and the second current $I_2$ of the second inductor 520 flows in a second direction different from the first direction, and magnetic fluxes of the inductor 510 and the second inductor 520 may be formed in opposite directions. Therefore, the mutual inductance M may have a negative (−) sign.

As shown in FIG. 10, a wiring of the first inductor 510 may be formed so as to surround a wiring of the second inductor 520, and thus the wiring of the second inductor 520 may be formed inside the wiring of the first inductor 510. The first terminal 510a of the first inductor 510 may be connected to an input terminal, and the second terminal 510b of the first inductor 510 may be connected to the impedance element 530 through the common node CN. Also, the first terminal 520a of the second inductor 520 may be connected to an output terminal, and the second terminal 520b of the second inductor 520 may connected to the impedance element 530 through the common node CN. Since the wiring of the second inductor 520 is formed inside the wiring of the first inductor 510, the first terminal 520a of the second inductor 520 may be connected to the output terminal by avoiding the wiring of the first inductor 510 and the wiring of the common node CN through a first contact CNT1 in order to prevent the first terminal 510a of the first inductor 510 from contacting the first terminal 520a of the second inductor 520.

As shown in FIG. 10, the direction of the first current $I_1$ flowing through the first inductor 510 and the direction of the second current $I_2$ flowing through the second inductor 520 are opposite to each other, and the magnetic fluxes of the first inductor 510 and the second inductor 520 may be formed in the opposite directions so that the negative mutual inductance (−M) is formed.

Figure 11:
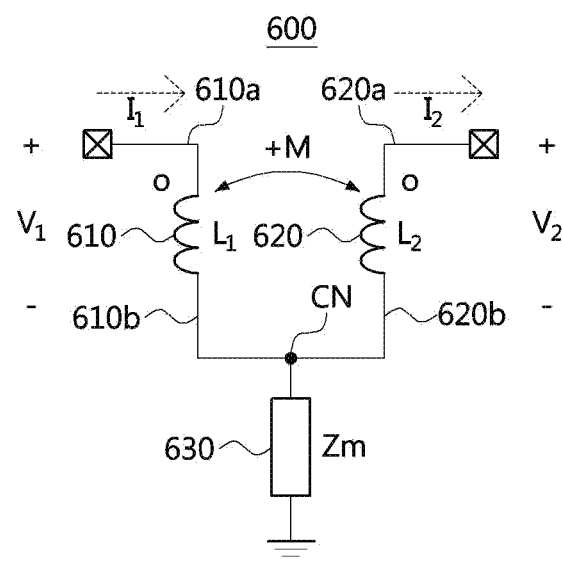
FIG. 11 is a diagram illustrating a matching circuit according to a fourth embodiment of the present disclosure.
Figure 12:
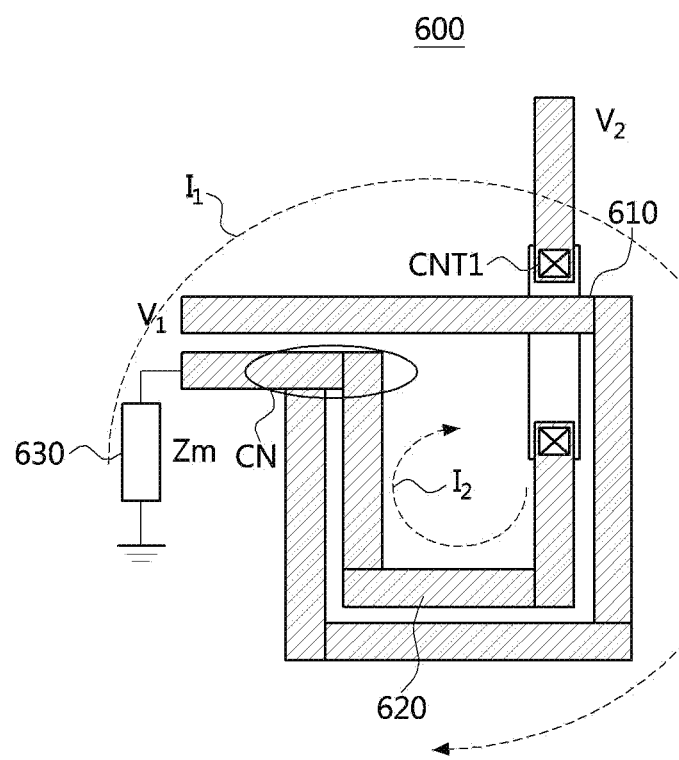
FIG. 12 is a diagram illustrating a layout of the matching circuit according to the fourth embodiment of the present disclosure.

FIG. 11 is a diagram illustrating a matching circuit according to a fourth embodiment of the present disclosure, and FIG. 12 is a diagram illustrating a layout of the matching circuit according to the fourth embodiment of the present disclosure.

Referring to FIGS. 11 and 12, the matching circuit 600 according to the fourth embodiment of the present disclosure may comprise a first inductor 610 disposed at a primary side, a second inductor 620 disposed at a secondary side, and an impedance element $Z_m$, 630.

A first voltage $V_1$ may be formed between a first terminal 610a and a second terminal 610b of the first inductor 610, and a first current $I_1$ may flow through the first inductor 610 according to the first voltage $V_1$. The second inductor 620 may be disposed so as to face the first inductor 610 so that a mutual inductance M may be formed between the first inductor 610 and the second inductor 620. A second voltage $V_2$ may be formed between a first terminal 620a and a second terminal 620b of the second inductor 620, and a second current $I_2$ may flow through the second inductor 620 according to the second voltage $V_2$. The second terminal 610b of the first inductor 610 and the second terminal 620b of the second inductor 620 may be connected to the impedance element 630 through the common node CN.

The impedance element 630 may be connected to the first inductor 610 and the second inductor 620. Also, a first terminal of the impedance element 630 may be connected to the second terminal 610b of the first inductor 610 and the second terminal 620b of the second inductor 620, and a second terminal of the impedance element 630 may be connected to a ground. That is, the second terminal 610b of the first inductor 610 and the second terminal 620b of the second inductor 620 may be connected in an edge-coupled manner through the common node CN so as to form a transformer.

As an example, in FIGS. 11 and 12, the first inductor 610 and the second inductor 620 have a turn ratio of 1:1. Also, since the first inductor 610 and the second inductor 620 are wounded in the same direction so that a positive mutual inductance (+M) is formed. That is, the first current $I_1$ of the first inductor 610 and the second current I₂ of the second inductor 620 flow in the same direction, and magnetic fluxes of the inductor 610 and the second inductor 620 may be formed in the same direction. Therefore, the mutual inductance M may have the positive (+) sign.

As shown in FIG. 12, a wiring of the first inductor 610 may be formed so as to surround a wiring of the second inductor 620, and thus the wiring of the second inductor 620 may be formed inside the wiring of the first inductor 610. Since the wiring of the second inductor 620 is formed inside the wiring of the first inductor 610, the first terminal 620a of the second inductor 620 may be connected to an output terminal by avoiding the wiring of the first inductor 610 through a first contact CNT1 in order to prevent the first terminal 610a of the first inductor 610 from contacting the first terminal 620a of the second inductor 620.

As shown in FIG. 12, the direction of the first current $I_1$ flowing through the first inductor 610 and the direction of the second current $I_2$ flowing through the second inductor 620 are the same, and the magnetic fluxes of the first inductor 610 and the second inductor 620 may be formed in the same direction so that the positive mutual inductance (M+) is formed.

Figure 13:
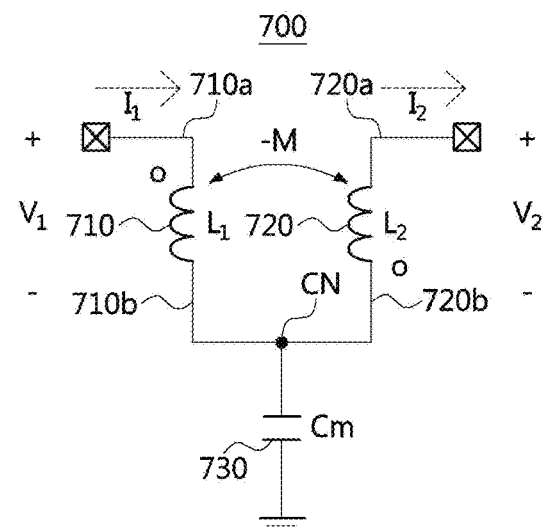
FIG. 13 is a diagram illustrating a matching circuit according to a fifth embodiment of the present disclosure.
Figure 14:
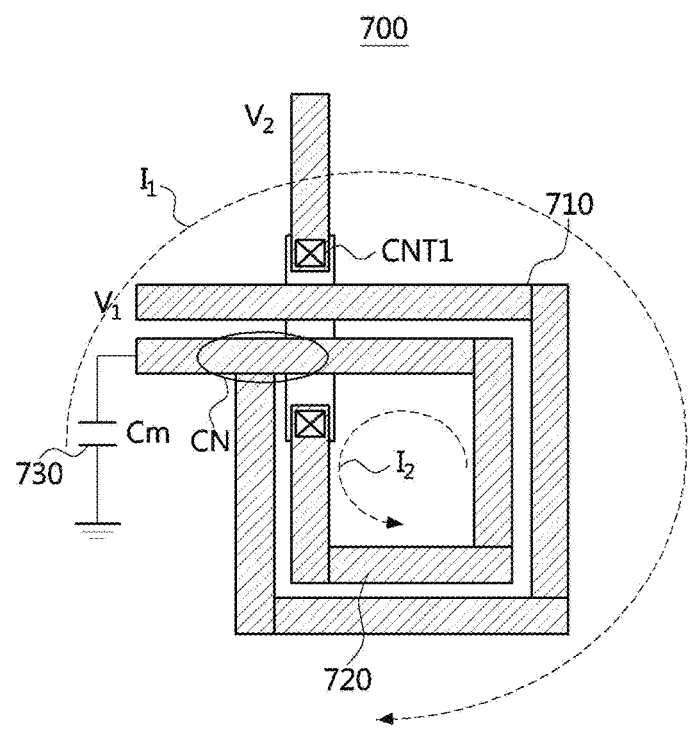
FIG. 14 is a diagram illustrating a layout of the matching circuit according to the fifth embodiment of the present disclosure.

FIG. 13 is a diagram illustrating a matching circuit according to a fifth embodiment of the present disclosure, and FIG. 14 is a diagram illustrating a layout of the matching circuit according to the fifth embodiment of the present disclosure.

Referring to FIGS. 13 and 14, the matching circuit 700 according to the fifth embodiment of the present disclosure may comprise a first inductor 710 disposed at a primary side, a second inductor 720 disposed at a secondary side, and a capacitor 730 connected to a common node CN. That is, in FIGS. 13 and 14, the capacitor 730 is applied as an impedance element.

A first voltage $V_1$ may be formed between a first terminal 710a and a second terminal 710b of the first inductor 710, and a first current $I_1$ may flow through the first inductor 710 according to the first voltage $V_1$. The second inductor 720 may be disposed so as to face the first inductor 710 so that a mutual inductance M may be formed between the first inductor 710 and the second inductor 720. A second voltage $V_2$ may be formed between a first terminal 720a and a second terminal 720b of the second inductor 720, and a second current $I_2$ may flow through the second inductor 720 according to the second voltage $V_2$. The second terminal 710b of the first inductor 710 and the second terminal 720b of the second inductor 720 may be connected to the capacitor 730 through the common node CN.

A first terminal of the capacitor 730 may be connected to the second terminal 710b of the first inductor 710 and the second terminal 720b of the second inductor 720, and a second terminal of the capacitor 730 may be connected to a ground. That is, the second terminal 710b of the first inductor 710 and the second terminal 720b of the second inductor 720 may be connected in an edge-coupled manner through the common node CN so as to form a transformer.

As an example, in FIGS. 13 and 14, the first inductor 710 and the second inductor 720 have a turn ratio of 1:1. Also, since the first inductor 710 and the second inductor 720 are wounded in the opposite directions so that a negative mutual inductance (−M) is formed. That is, the first current $I_1$ of the first inductor 710 flows in a first direction and the second current $I_2$ of the second inductor 720 flows in a second direction different from the first direction, and magnetic fluxes of the inductor 710 and the second inductor 720 may be formed in opposite directions. Therefore, the mutual inductance M may have a negative (−) sign.

As shown in FIG. 14, a first terminal 710a of the first inductor 710 may be connected to an input terminal, and a second terminal 710b of the first inductor 710 may be connected to the capacitor 730 through a common node CN. Also, a first terminal 720a of the second inductor 720 may be connected to an output terminal, and a second terminal 720b of the second inductor 720 may be connected to the capacitor 730 through the common node CN. A wiring of the first inductor 710 may be formed so as to surround a wiring of the second inductor 720, and thus the wiring of the second inductor 720 may be formed inside the wiring of the first inductor 710. The first terminal 720a of the second inductor 720 may be connected to the output terminal by avoiding the wiring of the first inductor 710 and the wiring of the common node CN through a first contact CNT1 in order to prevent the first terminal 710a of the first inductor 710 from contacting the first terminal 720a of the second inductor 720.

As shown in FIG. 14, the direction of the first current $I_1$ flowing through the first inductor 710 and the direction of the second current $I_2$ flowing through the second inductor 720 are opposite to each other, and the magnetic fluxes of the first inductor 710 and the second inductor 720 may be formed in the opposite directions so that the negative mutual inductance (−M) is formed. Here, the impedance of the capacitor 730 may have a value of $$-j\left(\frac{1}{wC_m}\right),$$

and the impedance value of the capacitor 730 may be subtracted from the mutual inductance M. Like this, by forming the transformer in an inverting manner, the mutual inductance M may be boosted.

Figure 15:
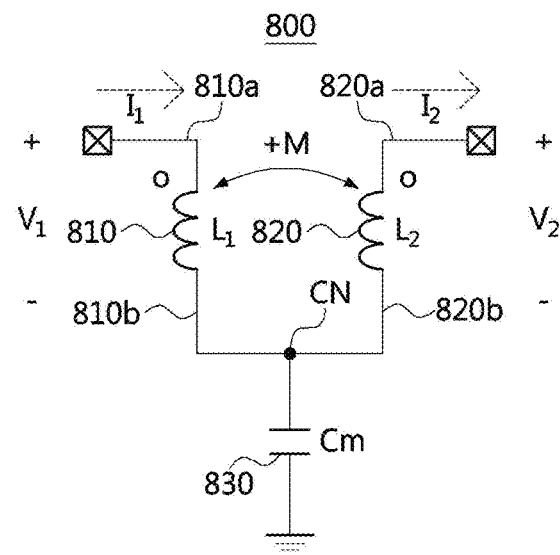
FIG. 15 is a diagram illustrating a matching circuit according to a sixth embodiment of the present disclosure.
Figure 16:
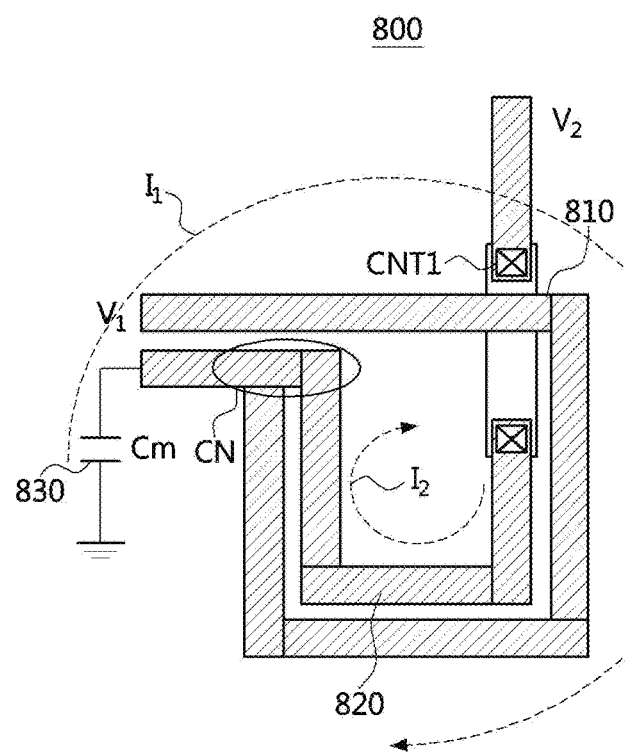
FIG. 16 is a diagram illustrating a layout of the matching circuit according to the sixth embodiment of the present disclosure.

FIG. 15 is a diagram illustrating a matching circuit according to a sixth embodiment of the present disclosure, and FIG. 16 is a diagram illustrating a layout of the matching circuit according to the sixth embodiment of the present disclosure.

Referring to FIGS. 15 and 16, the matching circuit 800 according to the sixth embodiment of the present disclosure may comprise a first inductor 810 disposed at a primary side, a second inductor 820 disposed at a secondary side, and a capacitor 830 connected to a common node CN. That is, in FIGS. 15 and 16, the capacitor 830 is applied as an impedance element.

A first voltage $V_1$ may be formed between a first terminal 810a and a second terminal 810b of the first inductor 810, and a first current $I_1$ may flow through the first inductor 810 according to the first voltage $V_1$. The second inductor 820 may be disposed so as to face the first inductor 810 so that a mutual inductance M may be formed between the first inductor 810 and the second inductor 820. A second voltage $V_2$ may be formed between a first terminal 820a and a second terminal 820b of the second inductor 820, and a second current $I_2$ may flow through the second inductor 820 according to the second voltage $V_2$. The second terminal 810b of the first inductor 810 and the second terminal 820b of the second inductor 820 may be connected to the capacitor 830 through the common node CN.

A first terminal of the capacitor 830 may be connected to the second terminal 810b of the first inductor 810 and the second terminal 820b of the second inductor 820, and a second terminal of the capacitor 830 may be connected to a ground. That is, the second terminal 810b of the first inductor 810 and the second terminal 820b of the second inductor 820 may be connected in an edge-coupled manner through the common node CN so as to form a transformer.

As an example, in FIGS. 15 and 16, the first inductor 810 and the second inductor 820 have a turn ratio of 1:1. Also, since the first inductor 810 and the second inductor 820 are wounded in the same direction so that a positive mutual inductance (+M) is formed. That is, the first current $I_1$ of the first inductor 810 flows in a first direction and the second current $I_2$ of the second inductor 820 flows in a second direction different from the first direction, and magnetic fluxes of the inductor 810 and the second inductor 820 may be formed in the same directions. Therefore, the mutual inductance M may have a positive (+) sign.

As shown in FIG. 16, the first terminal 810a of the first inductor 810 may be connected to an input terminal, and the second terminal 810b of the first inductor 810 may be connected to the capacitor 830 through the common node CN. Also, the first terminal 820a of the second inductor 820 may be connected to an output terminal, and the second terminal 820b of the second inductor 820 may be connected to the capacitor 830 through the common node CN. A wiring of the first inductor 810 may be formed so as to surround a wiring of the second inductor 820, and thus the wiring of the second inductor 820 may be formed inside the wiring of the first inductor 810. The first terminal 820a of the second inductor 820 may be connected to the output terminal by avoiding the wiring of the first inductor 810 through a first contact CNT1 in order to prevent the first terminal 810a of the first inductor 810 from contacting the first terminal 820a of the second inductor 820.

As shown in FIG. 16, the direction of the first current $I_1$ flowing through the first inductor 810 and the direction of the second current $I_2$ flowing through the second inductor 820 are the same, and the magnetic fluxes of the first inductor 810 and the second inductor 820 may be formed in the same direction so that the positive mutual inductance (M+) is formed.

Here, the impedance of the capacitor 830 may have a value of $$-j\left(\frac{1}{wC_m}\right),$$

and the impedance value of the capacitor 830 may be subtracted from the mutual inductance M. Like this, by forming the transformer in a non-inverting manner, the mutual inductance M may be reduced by subtracting the impedance of the capacitor 830 from the positive (+) mutual inductance M.

Figure 17:
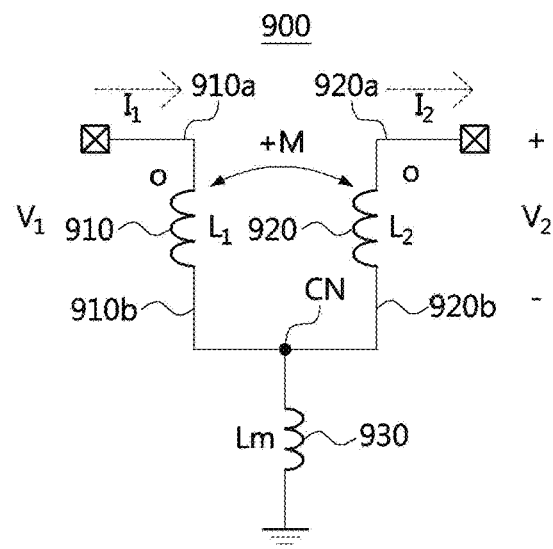
FIG. 17 is a diagram illustrating a matching circuit according to a seventh embodiment of the present disclosure.
Figure 18:
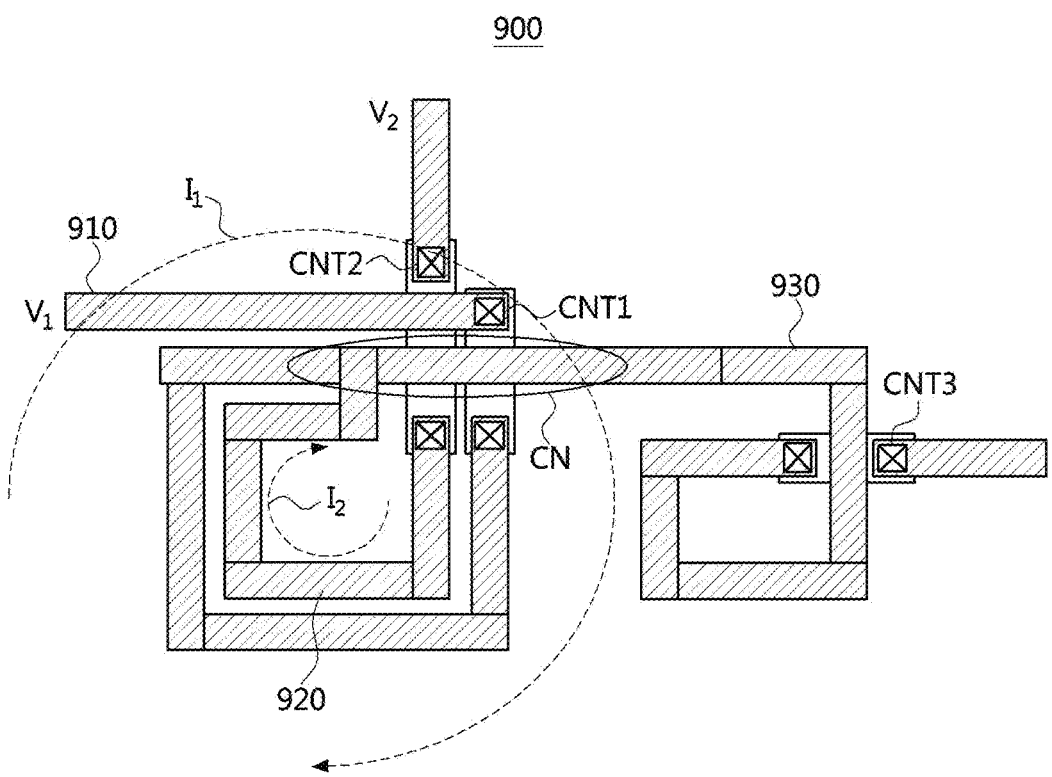
FIG. 18 is a diagram illustrating a layout of the matching circuit according to the seventh embodiment of the present disclosure.

FIG. 17 is a diagram illustrating a matching circuit according to a seventh embodiment of the present disclosure, and FIG. 18 is a diagram illustrating a layout of the matching circuit according to the seventh embodiment of the present disclosure.

Referring to FIGS. 17 and 18, the matching circuit 900 according to the seventh embodiment of the present disclosure may comprise a first inductor 910 disposed at a primary side, a second inductor 920 disposed at a secondary side, and a third inductor 930 connected to a common node CN. That is, in FIGS. 17 and 18, the third inductor 930 is applied as an impedance element.

A first voltage $V_1$ may be formed between a first terminal 910a and a second terminal 910b of the first inductor 910, and a first current $I_1$ may flow through the first inductor 910 according to the first voltage $V_1$. The second inductor 920 may be disposed so as to face the first inductor 910 so that a mutual inductance M may be formed between the first inductor 910 and the second inductor 920. A second voltage $V_2$ may be formed between a first terminal 920a and a second terminal 920b of the second inductor 920, and a second current $I_2$ may flow through the second inductor 920 according to the second voltage $V_2$. The second terminal 910b of the first inductor 910 and the second terminal 920b of the second inductor 920 may be connected to the third inductor 930 through the common node CN. A first terminal of the third inductor 930 may be connected to the second terminal 910b of the first inductor 910 and the second terminal 920b of the second inductor 920, and a second terminal of the third inductor 930 may be connected to a ground. That is, the second terminal 910b of the first inductor 910 and the second terminal 920b of the second inductor 920 may be connected in an edge-coupled manner through the common node CN so as to form a transformer.

As an example, in FIGS. 17 and 18, the first inductor 910 and the second inductor 920 have a turn ratio of 1:1. Also, since the first inductor 910 and the second inductor 920 are wounded in the same direction so that a positive mutual inductance (+M) is formed. That is, the first current $I_1$ of the first inductor 910 and the second current $I_2$ of the second inductor 920 flow in the same direction, and magnetic fluxes of the inductor 910 and the second inductor 920 may be formed in the same direction. Therefore, the mutual inductance M may have the positive (+) sign.

As shown in FIG. 18, the first terminal 910a of the first inductor 910 may be connected to an input terminal, and the second terminal 910b of the first inductor 910 may be connected to the third inductor 930 through the common node CN. Also, the first terminal 920a of the second inductor 920 may be connected to an output terminal, and the second terminal 920b of the second inductor 920 may be connected to the third inductor 930 through the common node CN.

Since a wiring of the second inductor 920 is formed inside a wiring of the first inductor 910, it is necessary to prevent the wirings of the first inductor 910, the second inductor 920, and the third inductor 930 from being contacted at nodes except the common node CN. For this, the wiring of the first inductor 910 may be connected to the common node CN by avoiding other wirings through a first contact CNT1. Also, the wiring of the second inductor 920 may be connected to the common node CN by avoiding other wirings through a second contact CNT2. The wiring of the second inductor 930 may be formed on one side of the wiring of the first inductor 910 and the wiring of the second inductor 920, and the wiring of the common node CN and the wiring of the third inductor 930 may be connected. The wiring of the third inductor 930 may be formed in a twisted manner not in a straight line in order to reduce a circuit area due to the formation of the third inductor 930. Therefore, the wiring of the third inductor 930 may be connected to the ground through a third contact CNT3 in order to prevent a short-circuit of the wiring of the third inductor 930.

As described above, the area for forming the matching circuit may be reduced by forming the first inductor 910, the second inductor 920, and the third inductor 930 on a substrate using a semiconductor manufacturing process, and respective inductances of the inductors 910, 920, and 930, and the mutual inductance M may be finely adjusted.

As shown in FIG. 18, the direction of the first current $I_1$ flowing through the first inductor 910 and the direction of the second current $I_2$ flowing through the second inductor 920 are the same, and the magnetic fluxes of the first inductor 910 and the second inductor 920 may be formed in the same direction so that the positive mutual inductance (M+) is formed. Here, the impedance of the third inductor 930 may have a value of $jwL_m$, the mutual inductance M may be boosted by adding the impedance of the third inductor 930 to the mutual inductance (+M).

Figure 19:
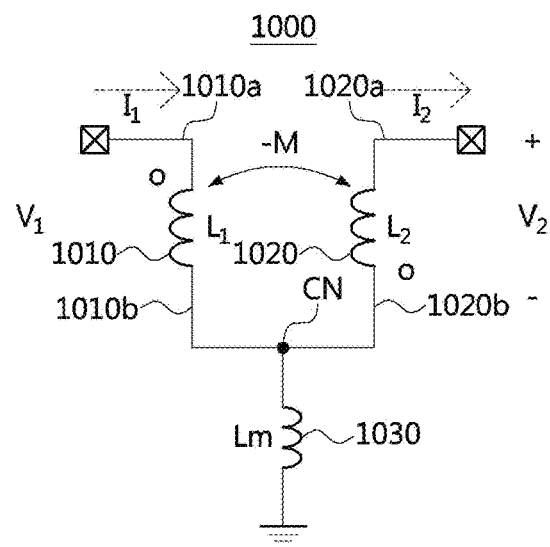
FIG. 19 is a diagram illustrating a matching circuit according to an eighth embodiment of the present disclosure.
Figure 20:
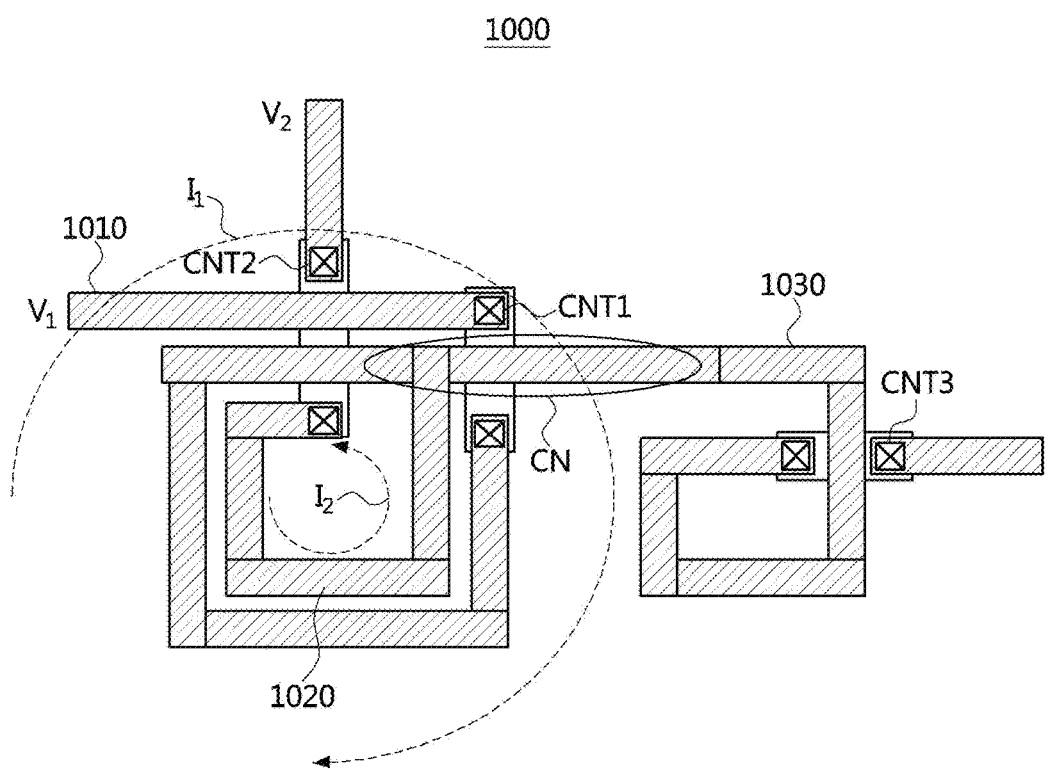
FIG. 20 is a diagram illustrating a layout of the matching circuit according to the eighth embodiment of the present disclosure.

FIG. 19 is a diagram illustrating a matching circuit according to an eighth embodiment of the present disclosure, and FIG. 20 is a diagram illustrating a layout of the matching circuit according to the eighth embodiment of the present disclosure.

Referring to FIGS. 19 and 20, the matching circuit 1000 according to the eighth embodiment of the present disclosure may comprise a first inductor 1010 disposed at a primary side, a second inductor 1020 disposed at a secondary side, and a third inductor 1030 connected to a common node CN. That is, in FIGS. 19 and 20, the third inductor $L_m$ 1030 is applied as an impedance element.

A first voltage $V_1$ may be formed between a first terminal 1010a and a second terminal 1010b of the first inductor 1010, and a first current $I_1$ may flow through the first inductor 1010 according to the first voltage $V_1$. The second inductor 1020 may be disposed so as to face the first inductor 1010 so that a mutual inductance M may be formed between the first inductor 1010 and the second inductor 1020. A second voltage $V_2$ may be formed between a first terminal 1020a and a second terminal 1020b of the second inductor 1020, and a second current $I_2$ may flow through the second inductor 1020 according to the second voltage $V_2$. The second terminal 1010b of the first inductor 1010 and the second terminal 1020b of the second inductor 1020 may be connected to the third inductor 1030 through the common node CN. A first terminal of the third inductor 1030 may be connected to the second terminal 1010b of the first inductor 1010 and the second terminal 1020b of the second inductor 1020, and a second terminal of the third inductor 1030 may be connected to a ground. That is, the second terminal 1010b of the first inductor 1010 and the second terminal 1020b of the second inductor 1020 may be connected in an edge-coupled manner through the common node CN so as to form a transformer.

As an example, in FIGS. 19 and 20, the first inductor 1010 and the second inductor 1020 have a turn ratio of 1:1. Also, since the first inductor 1010 and the second inductor 1020 are wounded in the opposite directions so that a negative mutual inductance (−M) is formed. That is, the first current $I_1$ of the first inductor 1010 and the second current $I_2$ of the second inductor 1020 flow in the opposite directions, and magnetic fluxes of the inductor 1010 and the second inductor 1020 may be formed in the opposite directions. Therefore, the mutual inductance M may have the negative (−) sign.

As shown in FIG. 20, the first terminal 1010a of the first inductor 1010 may be connected to an input terminal, and the second terminal 1010b of the first inductor 1010 may be connected to the third inductor 1030 through the common node CN. Also, the first terminal 1020a of the second inductor 1020 may be connected to an output terminal, and the second terminal 1020b of the second inductor 1020 may be connected to the third inductor 1030 through the common node CN.

Since a wiring of the second inductor 1020 is formed inside a wiring of the first inductor 1010, it is necessary to prevent the wirings of the first inductor 1010, the second inductor 1020, and the third inductor 1030 from being contacted at nodes except the common node CN. For this, the wiring of the first inductor 1010 may be connected to the common node CN by avoiding other wirings through a first contact CNT1. Also, the wiring of the second inductor 1020 may be connected to the common node CN by avoiding other wirings through a second contact CNT2. The wiring of the second inductor 1030 may be formed on one side of the wiring of the first inductor 1010 and the wiring of the second inductor 1020, and the wiring of the common node CN and the wiring of the third inductor 1030 may be connected. The wiring of the third inductor 1030 may be formed in a twisted manner not in a straight line in order to reduce a circuit area due to the formation of the third inductor 1030. Therefore, the wiring of the third inductor 1030 may be connected to a ground through a third contact CNT3 in order to prevent a short-circuit of the wiring of the third inductor 1030.

As described above, the area for forming the matching circuit may be reduced by forming the first inductor 1010, the second inductor 1020, and the third inductor 1030 on a substrate using a semiconductor manufacturing process, and respective inductances of the inductors 1010, 1020, and 1030, and the mutual inductance M may be finely adjusted.

As shown in FIG. 20, the direction of the first current $I_1$ flowing through the first inductor 1010 and the direction of the second current $I_2$ flowing through the second inductor 1020 are opposite to each other, and the magnetic fluxes of the first inductor 1010 and the second inductor 1020 may be formed in the opposite directions so that the negative mutual inductance (−M) is formed. Here, the impedance of the third inductor 1030 may have a value of $jwL_m$, and the mutual inductance M may be reduced by subtracting the impedance of the third inductor 1030 from the mutual inductance (−M).

Figure 21:
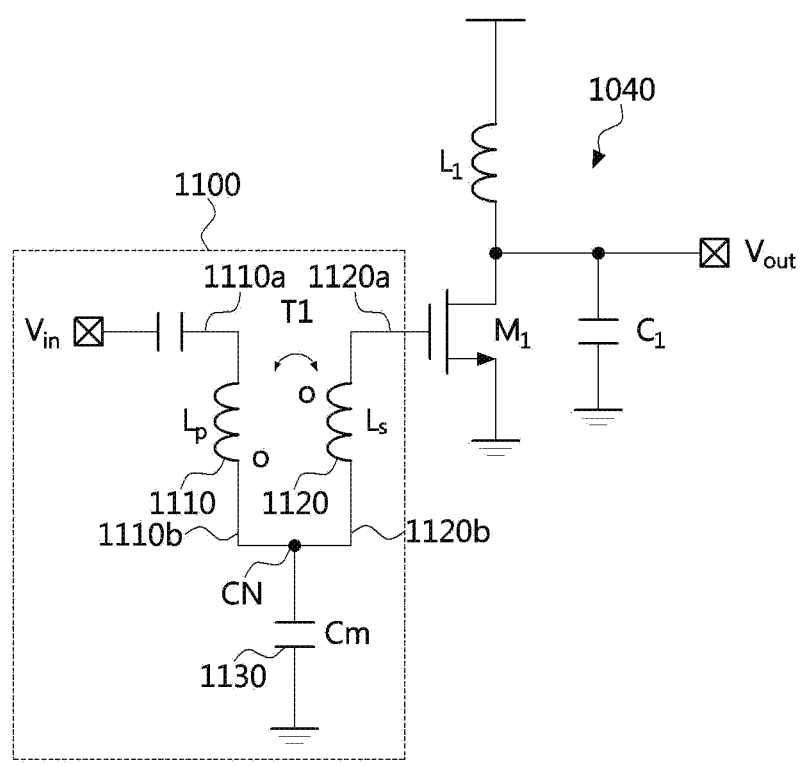
FIG. 21 is a diagram illustrating a matching circuit according to a ninth embodiment of the present disclosure.
Figure 22:
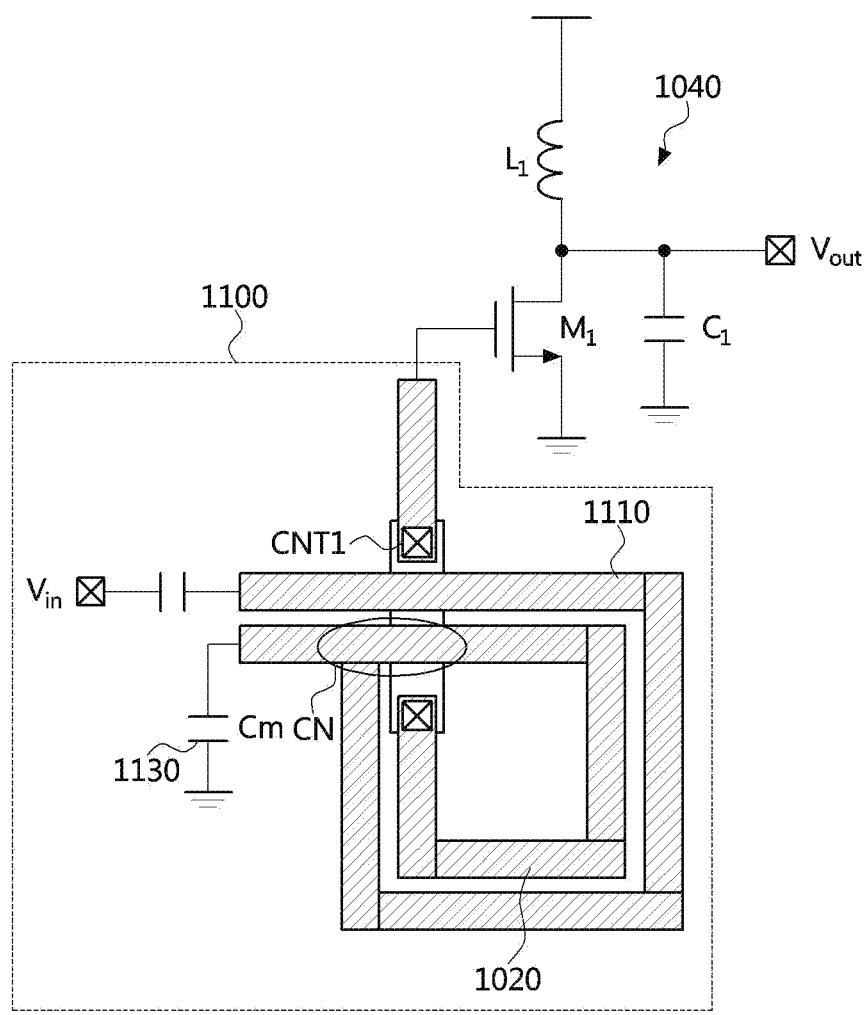
FIG. 22 is a diagram illustrating a layout of the matching circuit according to the ninth embodiment of the present disclosure.

FIG. 21 is a diagram illustrating a matching circuit according to a ninth embodiment of the present disclosure, and FIG. 22 is a diagram illustrating a layout of the matching circuit according to the ninth embodiment of the present disclosure.

Referring to FIGS. 21 and 22, the matching circuit 1100 according to the ninth embodiment of the present disclosure may comprise a first inductor 1110 disposed at a primary side, a second inductor 1120 disposed at a secondary side, and a capacitor 1130 connected to a common node CN. FIGS. 21 and 22 illustrate that the capacitor 1130 is applied as an impedance element, and an output of the matching circuit 1100 may be input to a high-frequency amplifier 1140. The high-frequency amplifier 1140 may include a transistor $M_1$, an inductor $L_1$, and a capacitor $C_1$, and the transistor $M_1$ may be configured in a common source form so that the output of the matching circuit 110 may be input to a gate G of the transistor $M_1$.

The second terminal 1110b of the first inductor 1110 and the second terminal 1120b of the second inductor 1120 may be connected to the capacitor 1130 through the common node CN. A first terminal of the third inductor 1130 may be connected to the second terminal 1110b of the first inductor 1110 and the second terminal 1120b of the second inductor 1120, and a second terminal of the capacitor 1130 may be connected to a ground. That is, the second terminal 1110b of the first inductor 1110 and the second terminal 1120b of the second inductor 1120 may be connected in an edge-coupled manner through the common node CN so as to form a transformer.

As an example, in FIGS. 21 and 22, the first inductor 1110 and the second inductor 1120 have a turn ratio of 1:1. Also, since the first inductor 1110 and the second inductor 1120 are wounded in the opposite directions so that a negative mutual inductance (−M) is formed. That is, the first current $I_1$ of the first inductor 1110 and the second current $I_2$ of the second inductor 1120 flow in the opposite directions, and magnetic fluxes of the inductor 1110 and the second inductor 1120 may be formed in the opposite directions. Therefore, the mutual inductance M may have the negative (−) sign.

As shown in FIG. 22, the first terminal 1110*a* of the first inductor 1110 may be connected to an input terminal, and the second terminal 1110*b* of the first inductor 1110 may be connected to the capacitor 1130 through the common node CN. Also, the first terminal 1120*a* of the second inductor 1120 may be connected to the gate G of the transistor $M_1$ disposed in the high-frequency amplifier 1140, and the second terminal 1120*b* of the second inductor 1120 may be connected to the capacitor 1130 through the common node CN. A wiring of the first inductor 1110 may be formed so as to surround a wiring of the second inductor 1120, and thus the wiring of the second inductor 1120 may be formed inside the wiring of the first inductor 1110.

The first terminal 1120*a* of the second inductor 1120 may be connected to the output terminal by avoiding the wiring of the first inductor 1110 and the wiring of the common node CN through a first contact CNT1 in order to prevent the first inductor 1110 and the second inductor 1120 from being in contact with each other at other nodes except the common node CN.

As shown in FIG. 22, the direction of the first current $I_1$ flowing through the first inductor 1110 and the direction of the second current $I_2$ flowing through the second inductor 1120 are opposite to each other, and the magnetic fluxes of the first inductor 1110 and the second inductor 1120 may be formed in the opposite directions so that the negative mutual inductance (−M) is formed. Here, the impedance of the capacitor 1130 may have a value of $$-j\left(\frac{1}{wC_m}\right),$$

the mutual inductance M may be reduced by subtracting the impedance of the capacitor 1130 from the mutual inductance M. Like this, by forming the transformer in the inverting manner, the mutual inductance M may be boosted.

Figure 23:
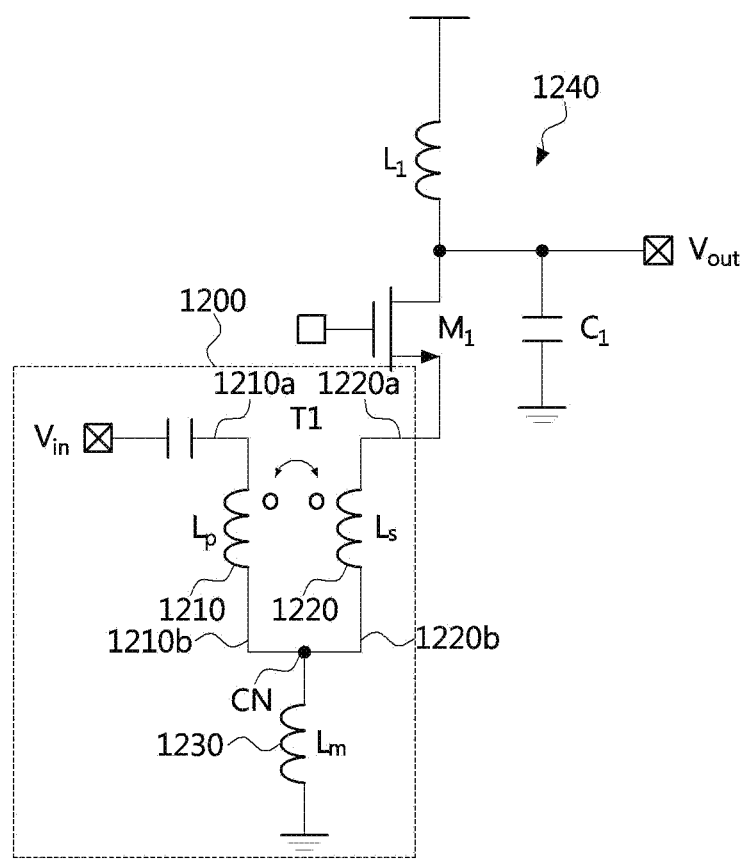
FIG. 23 is a diagram illustrating a matching circuit according to a tenth embodiment of the present disclosure.
Figure 24:
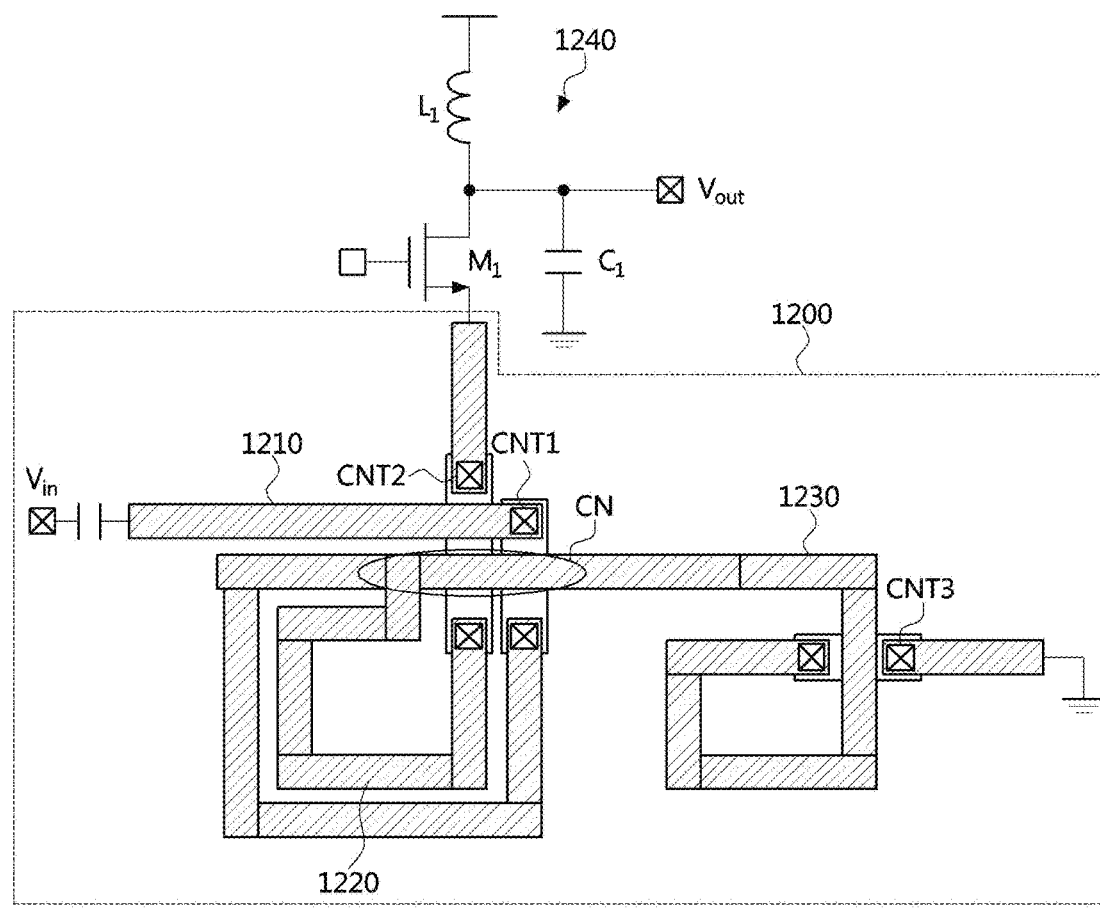
FIG. 24 is a diagram illustrating a layout of the matching circuit according to the tenth embodiment of the present disclosure.

FIG. 23 is a diagram illustrating a matching circuit according to a tenth embodiment of the present disclosure, and FIG. 24 is a diagram illustrating a layout of the matching circuit according to the tenth embodiment of the present disclosure.

Referring to FIGS. 23 and 24, the matching circuit 1200 according to the tenth embodiment of the present disclosure may comprise a first inductor 1210 disposed at a primary side, a second inductor 1220 disposed at a secondary side, and a third inductor 1230 connected to a common node CN. FIGS. 23 and 24 show an example in which the third inductor 1230 is applied as an impedance element, and an output of the matching circuit 1200 may be input to a high-frequency amplifier 1240. The high-frequency amplifier 1240 may comprise a transistor $M_1$, an inductor $L_1$, and a capacitor $C_1$. The transistor $M_1$ may be configured in a common gate form, and an output of the matching circuit 1200 may be input to a source S of the transistor $M_1$.

A second terminal 1210*b* of the first inductor 1210 and a second terminal 1220*b* of the second inductor 1220 may be connected to the third inductor 1230 through the common node CN. A first terminal of the third inductor 1230 may be connected to the second terminal 1210*b* of the first inductor 1210 and the second terminal 1220*b* of the second inductor 1220, and a second terminal of the capacitor 1230 may be connected to a ground. That is, the second terminal 1210*b* of the first inductor 1210 and the second terminal 1220*b* of the second inductor 1220 may be connected in an edge-coupled manner through the common node CN so as to form a transformer.

As an example, in FIGS. 23 and 24, the first inductor 1210 and the second inductor 1220 have a turn ratio of 1:1. Also, since the first inductor 1210 and the second inductor 1220 are wounded in the same direction so that a positive mutual inductance (+M) is formed. That is, the first current $I_1$ of the first inductor 1210 and the second current $I_2$ of the second inductor 1220 flow in the same direction, and magnetic fluxes of the inductor 1210 and the second inductor 1220 may be formed in the same direction. Therefore, the mutual inductance M may have the positive (+) sign.

As shown in FIG. 24, the first terminal 1210*a* of the first inductor 1210 may be connected to the input terminal, and the second terminal 1210*b* of the first inductor 1210 may be connected to the third inductor 1230 through the common node CN. Also, the first terminal 1220*a* of the second inductor 1220 may be connected to the source S of the transistor $M_1$ disposed in the high frequency amplifier 1240, and the second terminal 1220*b* of the second inductor 1220 may be connected to the third inductor 1230 through the common node CN. A wiring of the first inductor 1210 may be formed so as to surround a wiring of the second inductor 1220, and thus the wiring of the second inductor 1220 may be formed inside the wiring of the first inductor 1210.

In order to prevent the first inductor 1210, the second inductor 1220 and the third inductor 1230 from being in contact with each other in other nodes except the common node CN, the wiring of the first inductor 1210 may be connected to the common node CN through a first contact CNT1 by avoiding the wirings of the second inductor 1220 and the third inductor 1230. Also, the wiring of the second inductor 1220 may be connected to the high-frequency amplifier 1240 through a second contact CNT2 by avoiding the wirings of the first inductor 1210 and the common node CN. The wiring of the third inductor 1230 may be formed on one side of the wiring of the first inductor 1210 and the wiring of the second inductor 1220, and the wiring of the common node CN and the wiring of the third inductor 1230 may be connected to each other. The wiring of the third inductor 1230 may be formed in a twisted manner without forming the wiring of the third inductor 1230 in a straight line in order to reduce the circuit area due to the formation of the third inductor 1230. Therefore, the wiring of the third inductor 1230 may be connected to the ground GND through a third contact CNT3 in order to prevent the wiring of the third inductor 1230 from being short-circuited.

As described above, the area for forming the matching circuit may be reduced by forming the first inductor 1210, the second inductor 1220, and the third inductor 1230 on a substrate using a semiconductor manufacturing process, and the inductance value of each of the second inductor 1210, the second inductor 1220, and the third inductor 1230, and the mutual inductance M may be finely adjusted.

As shown in FIG. 24, the direction of the first current $I_1$ flowing through the first inductor 1210 and the direction of the second current $I_2$ flowing through the second inductor 1220 are the same, and the magnetic fluxes of the first inductor 1210 and the second inductor 1220 may be formed in the same direction so that the positive mutual inductance (+M) is formed. Here, the impedance of the third inductor 1230 may have a value of $jwL_m$, the mutual inductance +M may be boosted by adding the impedance of the third inductor 1230 to the mutual inductance +M.

Figure 25:
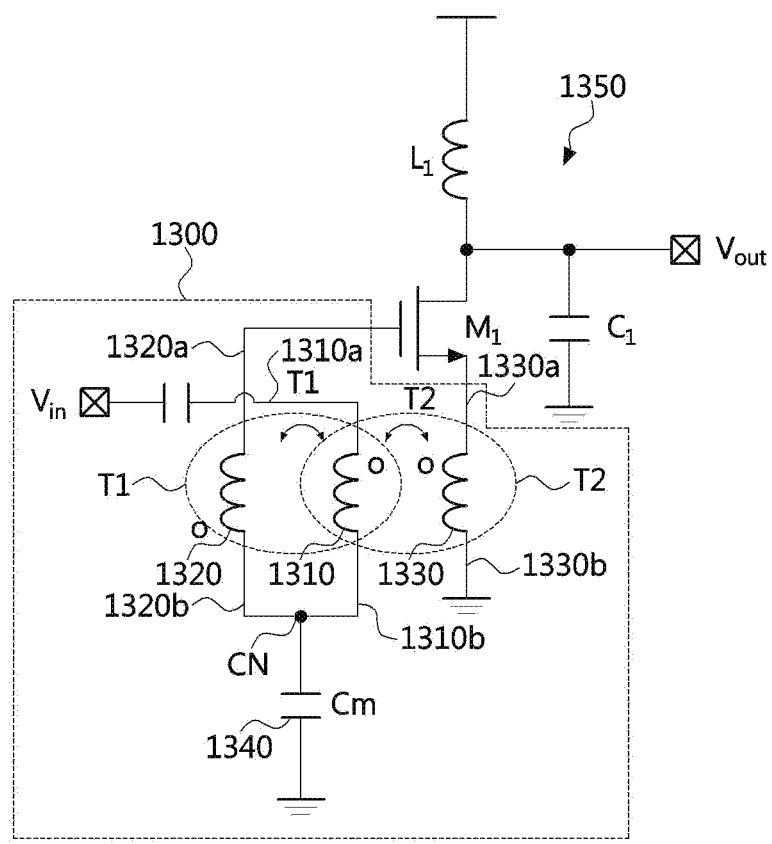
FIG. 25 is a diagram illustrating a matching circuit according to an eleventh embodiment of the present disclosure.
Figure 26:
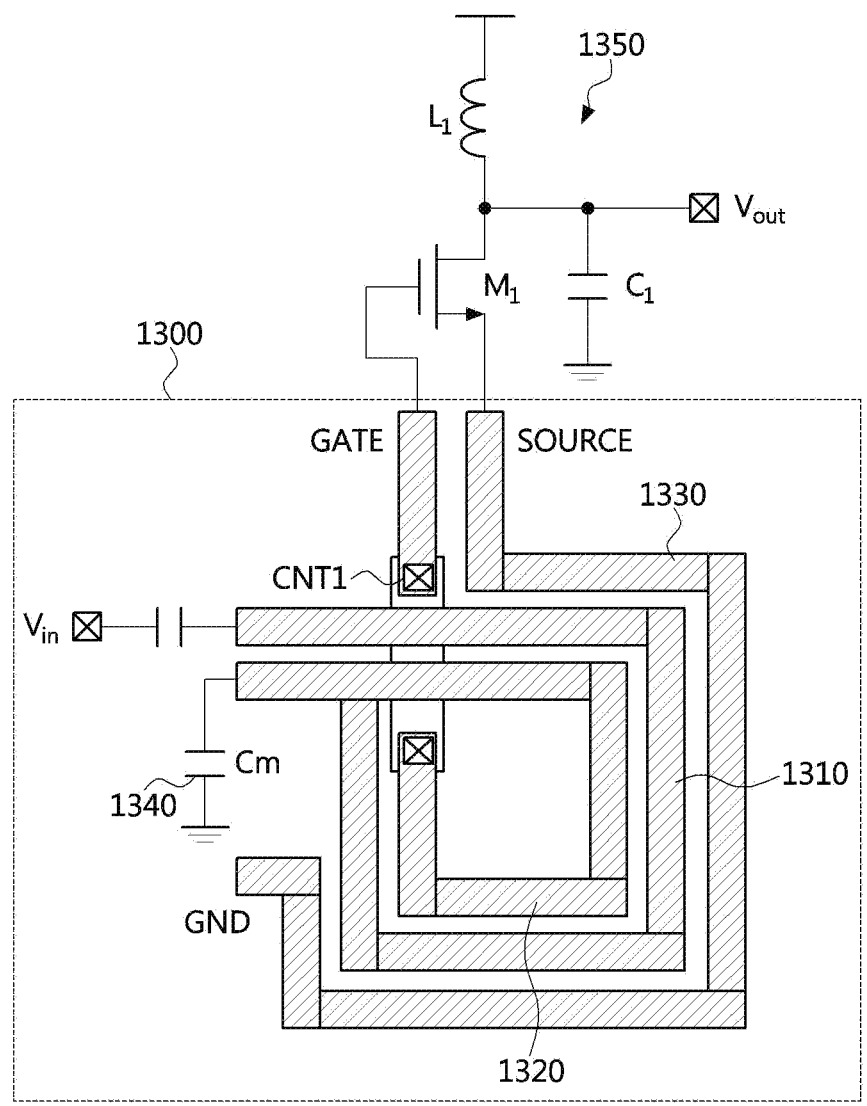
FIG. 26 is a diagram illustrating a layout of the matching circuit according to the eleventh embodiment of the present disclosure.

FIG. 25 is a diagram illustrating a matching circuit according to an eleventh embodiment of the present disclosure, and FIG. 26 is a diagram illustrating a layout of the matching circuit according to the eleventh embodiment of the present disclosure.

Referring to FIGS. 25 and 26, the matching circuit 1300 according to the eleventh embodiment of the present disclosure may comprise a first inductor 1310 disposed at a primary side, a second inductor 1320 disposed at a secondary side, a third inductor 1330 disposed at a tertiary side, and a capacitor 1340 connected to a common node CN. FIGS. 25 and 26 show an example in which the capacitor 1340 is applied as an impedance element, and an output of the matching circuit 1300 may be input to a high-frequency amplifier 1350. The high-frequency amplifier 1350 may comprise a transistor $M_1$, an inductor $L_1$, and a capacitor $C_1$. The secondary-side output of the matching circuit 1300 may be input to a gate G of the transistor $M_1$, and the tertiary-side output of the matching circuit 1300 may be input to a source S of the transistor $M_1$.

A second terminal 1310b of the first inductor 1310 and a second terminal 1320b of the second inductor 1320 may be connected to the capacitor 1340 through the common node CN. A first terminal of the capacitor 1340 may be connected to the second terminal 1310b of the first inductor 1310 and the second terminal 1320b of the second inductor 1320, and a second terminal of the capacitor 1340 may be connected to a ground. A first terminal 1330a of the third inductor 1330 may be connected to the source of the transistor $M_1$ disposed in the high-frequency amplifier 1350, and the second terminal 1330b of the third inductor 1330 may be connected to the ground. In this manner, source degeneration may be applied by connecting the third inductor 1330 to the source of the transistor $M_1$. That is, the second terminal 1310b of the first inductor 1310 and the second terminal 1320b of the second inductor 1320 may be connected in an edge-coupled manner through the common node CN so as to form the primary side and the secondary side of a transformer, and the third inductor 1330 may form the tertiary side of a transformer.

As an example, in FIGS. 25 and 26, the first inductor 1310, the second inductor 1320, and the third inductor 1330 may have a turn ratio of 1:1:1. Also, since the first inductor 1310 and the second inductor 1320 are wounded in the opposite directions so that a current at the primary side and a current at the secondary side may flow in the opposite directions. Through this, a negative mutual inductance (−M) may be formed at T1 between the primary side and the secondary side. Also, since the second inductor 1320 and the third inductor 1330 are wounded in the same direction so that a current at the secondary side and a current at the tertiary side may flow in the same direction. Through this, a negative mutual inductance (−M) may be formed at T2 between the secondary side and the tertiary side.

The first terminal 1310a of the first inductor 1310 may be connected to the input terminal, and the second terminal 1310b of the first inductor 1310 may be connected to the capacitor 1340 through the common node CN. Also, the first terminal 1320a of the second inductor 1320 may be connected to the gate G of the transistor $M_1$ disposed in the high frequency amplifier 1340, and the second terminal 1320b of the second inductor 1320 may be connected to the capacitor 1340 through the common node CN.

A wiring of the third inductor 1330 may be formed so as to surround a wiring of the first inductor 1310 and the second inductor 1320, and thus the wirings of the firs inductor 1310 and the second inductor 1320 may be formed inside the wiring of the third inductor 1330. Also, the wiring of the first inductor 1310 may be formed so as to surround the wiring of the second inductor 1320, and thus the wiring of the second inductor 1320 may be formed inside the wiring of the first inductor 1310.

In order to prevent the first inductor 1310, the second inductor 1320 and the third inductor 1330 from being in contact with each other in other nodes except the common node CN, the first terminal 1320a of the second inductor 1320 may be connected to the transistor $M_1$ through a first contact CNT1 by avoiding the wiring of the first inductor 1310 and the wiring of the common node CN.

The capacitor 1340 may boost the mutual inductance M. The impedance of the capacitor 1340 may have a value of $$-j\left(\frac{1}{wC_m}\right),$$

and the impedance value of the capacitor 1340 may be subtracted from the mutual inductance M value. Like this, by forming the transformer in the inverting manner, the mutual inductance M may be boosted. The primary side and the secondary side form the mutual inductances in opposite directions so as to increase an input voltage swing of the transistor $M_1$, and the third inductor 1330 may adjust an impedance of the transistor $M_1$ by applying source degeneration.

However, embodiments of the present disclosure are not limited thereto, and the first inductor 1310 and the second inductor 1320 may be wounded in the same direction so that the first current at the primary side and the second current at the secondary side may flow in the same direction. Through this, a positive mutual inductance (+M) may be formed at T1 between the primary side and the secondary side. Also, the second inductor 1320 and the third inductor 1330 may be wounded in the opposite directions so that the current at the secondary side and the current at the tertiary side may flow in the opposite directions. Thus, a negative mutual inductance (−M) may be formed at T2 between the secondary side and the tertiary side.

Figure 27:
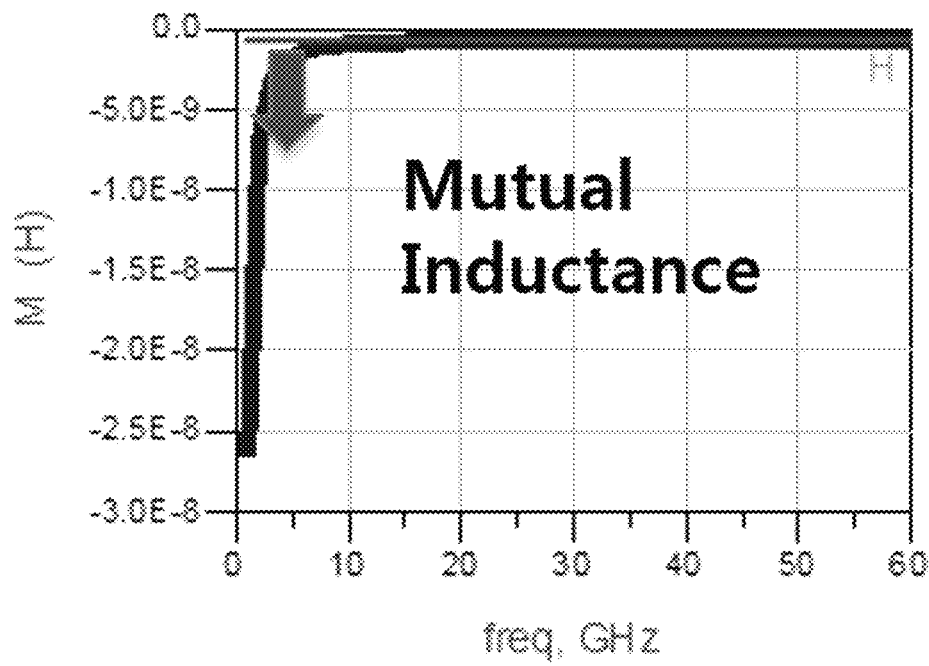
FIG. 27 is a diagram for explaining an effect of adjusting and boosting the mutual inductance in the matching circuit according to the fifth embodiment of the present disclosure shown in FIGS. 13 and 14.
Figure 27:
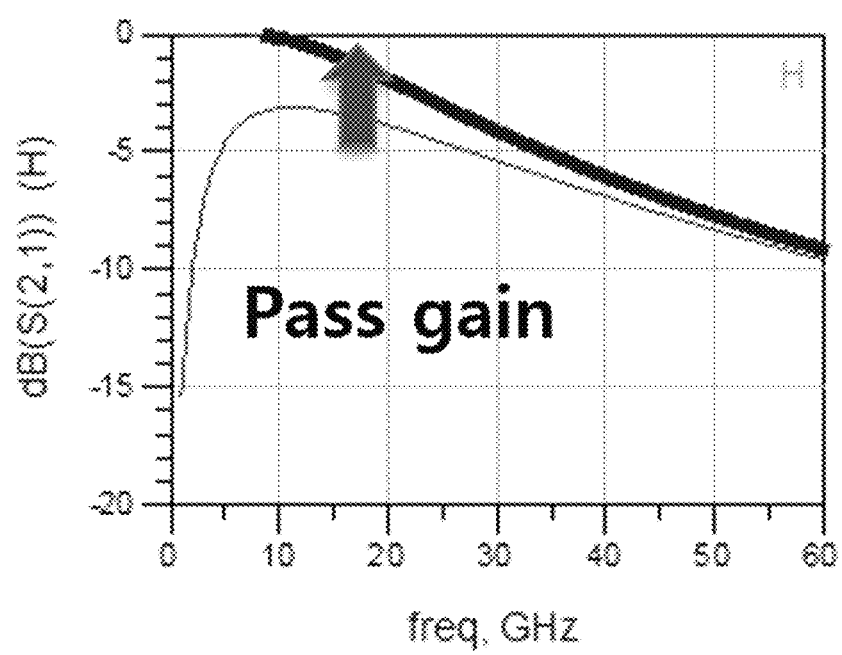

FIG. 27 is a diagram for explaining an effect of adjusting and boosting the mutual inductance in the matching circuit according to the fifth embodiment of the present disclosure shown in FIGS. 13 and 14.

Referring to FIG. 27 together with FIGS. 13 and 14, experimental results when $L_1$=1 nH, $L_2$=1 nH, and $C_m$=1 pF and a coupling coefficient between $L_1$ and $L_2$ is −0.7 are shown. In order to compare a difference between performances of the matching circuit and a general matching circuit, mutual inductances and pass gains when the capacitor 730 is connected to the transformer and when the capacitor 730 is not connected to the transformer are shown in comparison with each other. As shown in FIG. 27, in the case that the negative mutual inductance (−M) is formed and the capacitor 730 is connected to the common node as the fifth embodiment of the present disclosure, the effect of boosting the mutual inductance and increasing the pass gain may be confirmed. Specifically, the mutual inductance is increased in absolute value from −0.7 nH to −1 nH, and the pass gain at 10 GHz is increased from −3 dB to −0.15 dB.

Figure 28:
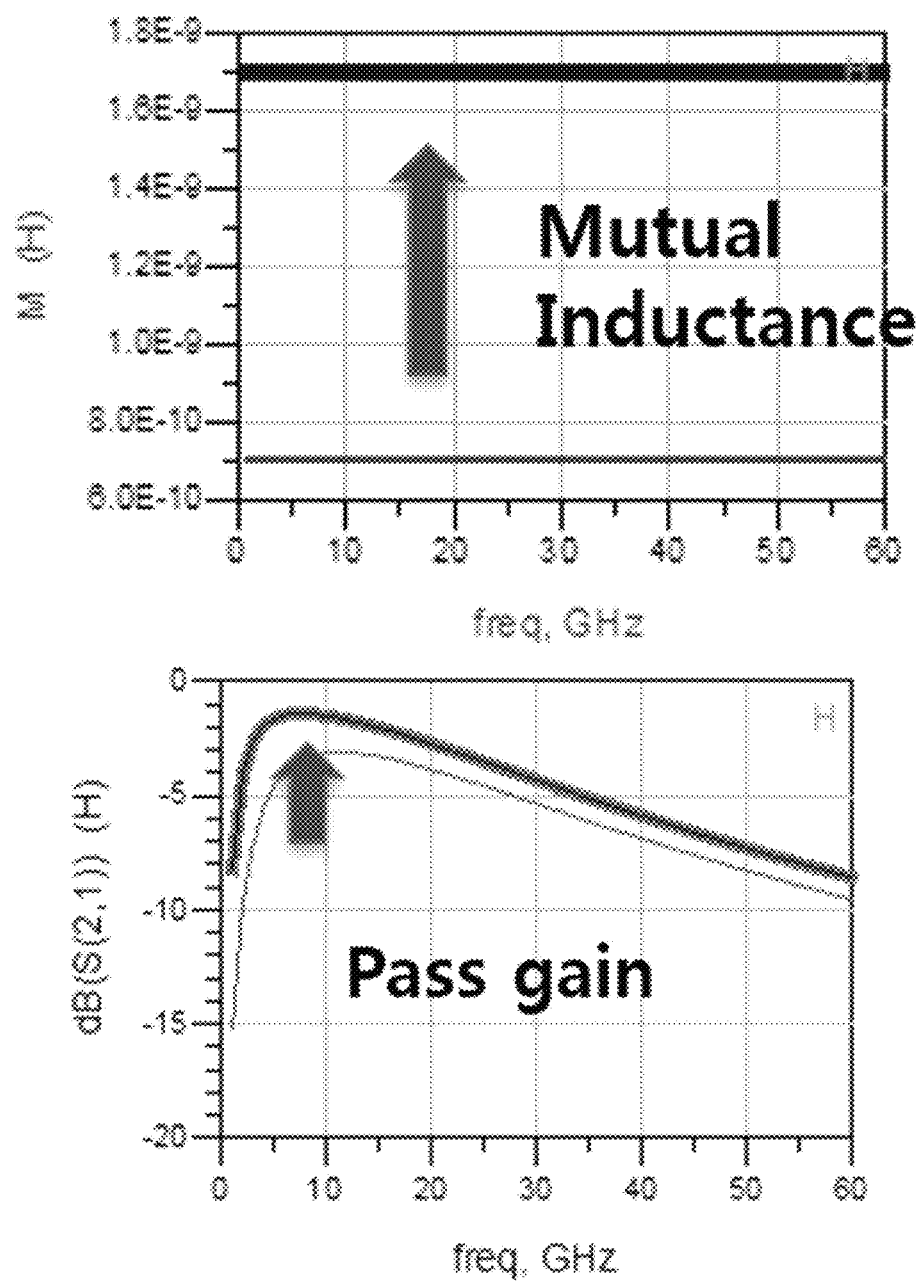
FIG. 28 is a diagram for explaining an effect of adjusting and boosting the mutual inductance in the matching circuit according to the seventh embodiment of the present disclosure shown in FIGS. 17 and 18.

FIG. 28 is a diagram for explaining an effect of adjusting and boosting the mutual inductance in the matching circuit according to the seventh embodiment of the present disclosure shown in FIGS. 17 and 18.

Referring to FIG. 28 together with FIGS. 17 and 18, experimental results when $L_1$=1 nH, $L_2$=1 nH, and $L_m$=1 nH and a coupling coefficient between $L_1$ and $L_2$ is −0.7 are shown. In order to compare a difference between performances of the matching circuit and a general matching circuit, mutual inductances and pass gains when the third inductor 930 is connected to the transformer and when the third inductor 930 is not connected to the transformer are shown in comparison with each other.

As shown in FIG. 28, in the case that the positive mutual inductance (+M) is formed and the third inductor 930 is connected to the common node as the seventh embodiment of the present disclosure, the effect of boosting the mutual inductance and increasing the pass gain may be confirmed. Specifically, the mutual inductance is increased from 0.7 nH to 1.7 nH, and the pass gain at 10 GHz is increased from −3 dB to −1.4 dB.

The matching circuit of a communication apparatus according to embodiments of the present disclosure can increase the mutual inductance value per area and finely adjust the inductance value when the matching circuit using the transformer is used. Also, the coupling coefficient between the primary coil and the secondary coil can be controlled, and the polarities of both ends of the transformer can be adjusted without being affected by specific implementations of the transformer. Also, a capacitor or an inductor can be connected to the common node to boost the mutual inductance of the transformer, and to increase the pass gain.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as

ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A matching circuit in a communication apparatus, comprising:
   a first inductor disposed at a primary side of a transformer;
   a second inductor disposed at a secondary side of the transformer;
   a third inductor disposed as a tertiary side of the transformer; and
   an impedance element connected to the first inductor and the second inductor,
   wherein a first terminal of the first inductor is connected to an input terminal of the transformer, a second terminal of the first inductor is connected to a common node connected to a ground, a first terminal of the second inductor is connected to a high-frequency amplifier, a second terminal of the second inductor is connected to the common node, a first terminal of the third inductor is connected to the high-frequency amplifier, a second terminal of the third inductor is connected to the ground, a first terminal of the impedance element is connected to the common node, and a second terminal of the impedance element is connected to the ground.

2. The matching circuit according to claim 1, wherein magnetic fluxes of the first inductor and the second inductor are formed in a same direction so as to form a positive mutual inductance between the first inductor and the second inductor.

3. The matching circuit according to claim 2, wherein magnetic fluxes of the second inductor and the third inductor are formed in opposite directions so as to form a negative mutual inductance between the second inductor and the third inductor.

4. The matching circuit according to claim 3, wherein the first terminal of the second inductor is connected to a base of a transistor constituting the high-frequency amplifier, and the first terminal of the third inductor is connected to a source of the transistor.

5. The matching circuit according to claim 1, wherein magnetic fluxes of the first inductor and the second inductor are formed in opposite directions so as to form a negative mutual inductance between the first inductor and the second inductor.

6. The matching circuit according to claim 5, wherein the impedance element is a capacitor, and the capacitor boosts the negative mutual inductance formed between the first inductor and the second inductor.

7. The matching circuit according to claim 5, wherein magnetic fluxes of the second inductor and the third inductor are formed in a same direction so as to form a negative mutual inductance between the second inductor and the third inductor.

8. The matching circuit according to claim 7, wherein the first terminal of the second inductor is connected to a base of a transistor constituting the high-frequency amplifier, and the first terminal of the third inductor is connected to a source of the transistor.

* * * * *